United States Patent
Slovin et al.

(10) Patent No.: US 10,937,960 B2
(45) Date of Patent: Mar. 2, 2021

(54) CONCURRENT FABRICATION OF AND STRUCTURE FOR CAPACITIVE TERMINALS AND OHMIC TERMINALS IN A PHASE-CHANGE MATERIAL (PCM) RADIO FREQUENCY (RF) SWITCH

(71) Applicant: Newport Fab, LLC, Newport Beach, CA (US)

(72) Inventors: Gregory P. Slovin, Irvine, CA (US); Nabil El-Hinnawy, Irvine, CA (US); Jefferson E. Rose, Hawthorne, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/271,505

(22) Filed: Feb. 8, 2019

(65) Prior Publication Data

US 2020/0058861 A1 Feb. 20, 2020

Related U.S. Application Data

(63) Continuation-in-part of application No. 16/231,121, filed on Dec. 21, 2018, now Pat. No. 10,770,389, and
(Continued)

(51) Int. Cl.
 *H01L 45/00* (2006.01)

(52) U.S. Cl.
 CPC .......... *H01L 45/1253* (2013.01); *H01L 45/06* (2013.01); *H01L 45/1226* (2013.01);
(Continued)

(58) Field of Classification Search
 None
 See application file for complete search history.

(56) References Cited

U.S. PATENT DOCUMENTS

| | | |
|---|---|---|
| 6,535,545 B1 | 1/2003 | Ben-Bassat |
| 7,522,029 B1 | 4/2009 | Lantz |

(Continued)

FOREIGN PATENT DOCUMENTS

WO WO 2016/028362 2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Bradley Smith
(74) *Attorney, Agent, or Firm* — Farjami & Farjami LLP

(57) ABSTRACT

A radio frequency (RF) switch includes a phase-change material (PCM), a heating element underlying an active segment of the PCM and extending outward and transverse to the PCM, a capacitive RF terminal, and an ohmic RF terminal. The capacitive RF terminal can include a first trench metal liner situated on a first passive segment of the PCM, and a dielectric liner separating the first trench metal liner from a first trench metal plug. The ohmic RF terminal can include a second trench metal liner situated on a second passive segment of the PCM, and a second trench metal plug ohmically connected to the second trench metal liner. Alternatively, the capacitive RF terminal and the ohmic RF terminal can include lower metal portions and upper metal portions. A MIM capacitor can be formed by the upper metal portion of the capacitive RF terminal, an insulator, and a patterned top plate.

19 Claims, 22 Drawing Sheets

Related U.S. Application Data a continuation-in-part of application No. 16/114,106, filed on Aug. 27, 2018, now Pat. No. 10,707,125, and a continuation-in-part of application No. 16/103,587, filed on Aug. 14, 2018, now Pat. No. 10,461,253, and a continuation-in-part of application No. 16/103,490, filed on Aug. 14, 2018, now Pat. No. 10,476,001, and a continuation-in-part of application No. 16/103,646, filed on Aug. 14, 2018, now Pat. No. 10,475,993.

(52) U.S. Cl.
CPC .......... *H01L 45/143* (2013.01); *H01L 45/144* (2013.01); *H01L 45/16* (2013.01)

(56) References Cited

U.S. PATENT DOCUMENTS

| | | | |
|---|---|---|---|
| 8,314,983 | B2 | 11/2012 | Frank |
| 2,014,181 | A1 | 7/2014 | Moon |
| 9,257,647 | B2 | 2/2016 | Borodulin |
| 9,362,492 | B2 | 6/2016 | Goktepeli |
| 9,368,720 | B1* | 6/2016 | Moon ............... H01L 45/1286 |
| 9,444,430 | B1 | 9/2016 | Abdo |
| 9,601,545 | B1 | 3/2017 | Tu |
| 9,640,759 | B1 | 5/2017 | Curioni |
| 9,891,112 | B1 | 2/2018 | Abel |
| 9,917,104 | B1 | 3/2018 | Roizin |
| 10,128,243 | B2 | 11/2018 | Yoo et al. |
| 10,164,608 | B2 | 12/2018 | Belot |
| 10,461,253 | B1 | 10/2019 | Slovin |
| 10,505,106 | B1 | 12/2019 | Joshi |
| 10,529,922 | B1 | 1/2020 | Howard |
| 2005/0127348 | A1 | 6/2005 | Horak |
| 2006/0246712 | A1 | 11/2006 | Kim |
| 2007/0075347 | A1 | 4/2007 | Lai |
| 2007/0099405 | A1* | 5/2007 | Oliva ............... H01L 45/1226 438/585 |
| 2007/0246766 | A1 | 10/2007 | Liu |
| 2008/0142775 | A1 | 6/2008 | Chen |
| 2008/0142777 | A1 | 6/2008 | Park |
| 2008/0272355 | A1 | 11/2008 | Cho |
| 2008/0291718 | A1 | 11/2008 | Liu |
| 2009/0065761 | A1 | 3/2009 | Chen |
| 2009/0236691 | A1* | 9/2009 | Dyer ............... H01L 27/1087 257/532 |
| 2009/0239372 | A1* | 9/2009 | Cohen ............. H01L 21/76873 438/618 |
| 2010/0084626 | A1 | 4/2010 | Delhougne |
| 2010/0238720 | A1 | 9/2010 | Tio Castro |
| 2010/0246247 | A1 | 9/2010 | Kim |
| 2011/0097825 | A1 | 4/2011 | Cheng |
| 2011/0291784 | A1 | 12/2011 | Nakatsuji |
| 2012/0037872 | A1 | 2/2012 | Ikarashi |
| 2013/0187120 | A1 | 7/2013 | Redaelli |
| 2013/0285000 | A1 | 10/2013 | Arai |
| 2014/0110657 | A1 | 4/2014 | Redaelli |
| 2014/0191181 | A1 | 7/2014 | Moon |
| 2014/0264230 | A1 | 9/2014 | Borodulin |
| 2014/0339610 | A1 | 11/2014 | Rashed |
| 2015/0048424 | A1 | 2/2015 | Tien |
| 2015/0090949 | A1 | 4/2015 | Chang |
| 2015/0333131 | A1 | 11/2015 | Mojumder |
| 2016/0035973 | A1 | 2/2016 | Raieszadeh |
| 2016/0056373 | A1 | 2/2016 | Goktepeli |
| 2016/0300612 | A1* | 10/2016 | Manipatruni ....... G11C 11/1659 |
| 2016/0308507 | A1 | 10/2016 | Engelen |
| 2017/0092694 | A1 | 3/2017 | BrightSky |
| 2017/0126205 | A1 | 5/2017 | Lin |
| 2017/0187347 | A1 | 6/2017 | Rinaldi |
| 2017/0207764 | A1 | 7/2017 | Wang |
| 2017/0243861 | A1 | 8/2017 | Wang |
| 2017/0365427 | A1 | 12/2017 | Borodulin |
| 2018/0005786 | A1 | 1/2018 | Navarro |
| 2018/0138894 | A1 | 5/2018 | Belot |
| 2018/0194615 | A1 | 7/2018 | Nawaz |
| 2018/0266974 | A1 | 9/2018 | Khosravani |
| 2018/0269393 | A1 | 9/2018 | Zhang |
| 2019/0064555 | A1 | 2/2019 | Hosseini |
| 2019/0067572 | A1 | 2/2019 | Tsai |
| 2019/0088721 | A1 | 3/2019 | Reig |
| 2019/0165264 | A1 | 5/2019 | Wu |
| 2019/0172657 | A1 | 6/2019 | Zhu |
| 2019/0267214 | A1 | 8/2019 | Liu |
| 2019/0296718 | A1 | 9/2019 | Birkbeck |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," 2013 IEEE Compound Semiconductor Integrated Circuit Symposium (CSICS), Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

Moon, et al. "Phase-Change RF Switches with Robust Switching Cycle Endurance," *2018 IEEE Radio and Wireless Symposium (RWS)*, pp. 231-233, Jan. 2018, Anaheim, CA.

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

\* cited by examiner

CONCURRENT FABRICATION OF AND STRUCTURE FOR CAPACITIVE TERMINALS AND OHMIC TERMINALS IN A PHASE-CHANGE MATERIAL (PCM) RADIO FREQUENCY (RF) SWITCH

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/231,121 filed on Dec. 21, 2018, titled "Phase-Change Material (PCM) Radio Frequency (RF) Switches with Capacitively Coupled RF Terminals,". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

It is sometimes desirable to avoid fabricating only ohmic contacts for connecting to RF terminals of a PCM RF switch. In those instances, a robust capacitive (and non-ohmic) contact can be a good choice. However, capacitance fabrication techniques applicable to conventional semiconductor devices may not be optimum for, or easily compatible with, PCM RF switches, and may not properly utilize or take advantage of the unique structure, layout, and geometry of PCM RF switches. Moreover, it is often desirable to have both ohmic and capacitive contacts for connecting to RF terminals of PCM RF switches. As such, concurrently fabricating both capacitive and ohmic RF terminals in PCM RF switches can present additional and significant manufacturing challenges.

Thus, there is a need in the art to reliably and concurrently manufacture both capacitive and ohmic RF terminals for PCM RF switches.

SUMMARY

The present disclosure is directed to concurrent fabrication of and structure for capacitive terminals and ohmic terminals in a phase-change material (PCM) radio frequency (RF) switch, substantially as shown in and/or described in connection with at least one of the figures, and as set forth in the claims.

DETAILED DESCRIPTION

Figure 1:
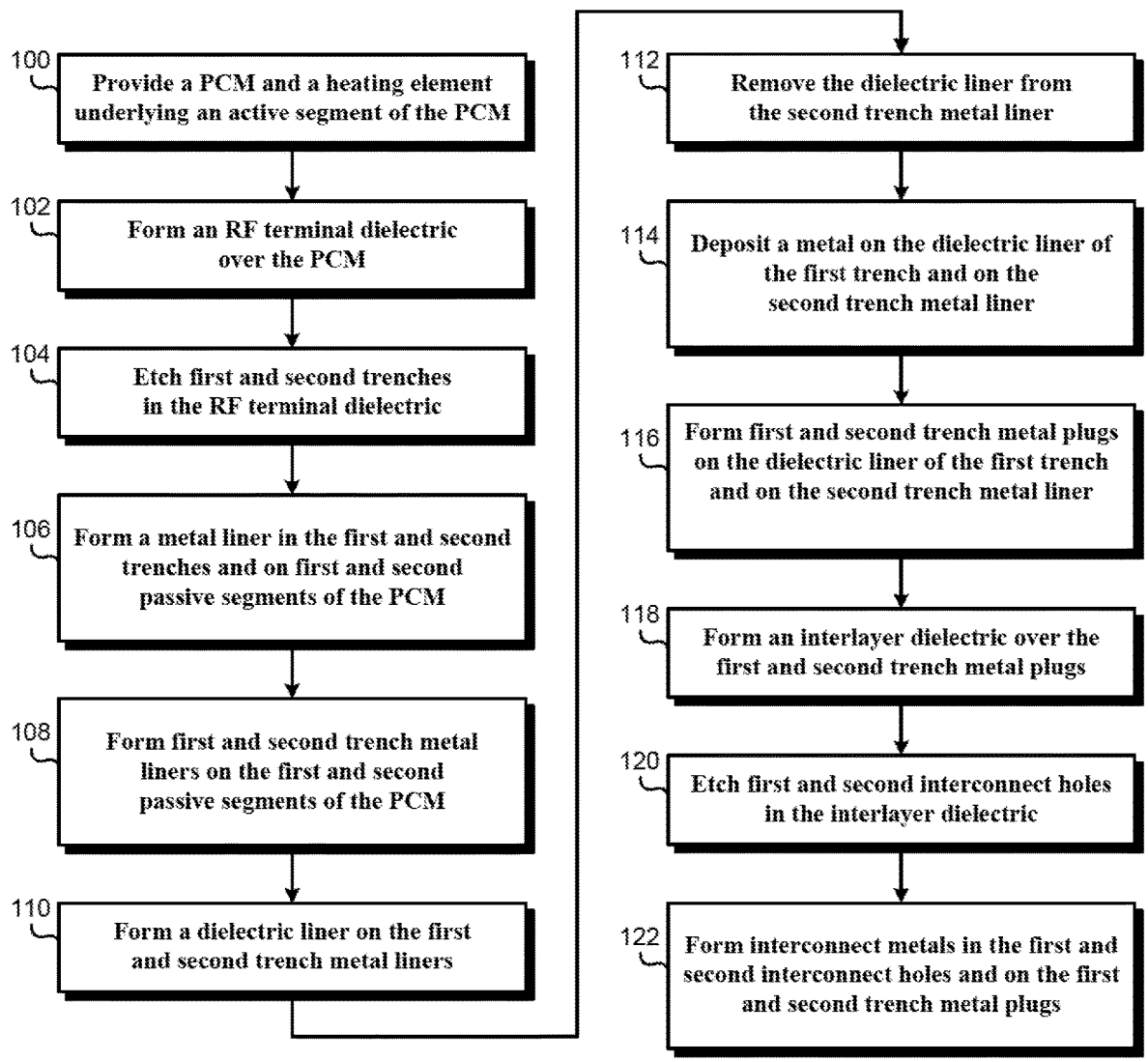
FIG. 1 illustrates a portion of a flowchart of an exemplary method for concurrently manufacturing both a capacitive radio frequency (RF) terminal and an ohmic RF terminal in a phase-change material (PCM) RF switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a portion of a flowchart of an exemplary method for concurrently manufacturing both a capacitive radio frequency (RF) terminal and an ohmic RF terminal in a phase-change material (PCM) RF switch according to one implementation of the present application. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions. Actions 100 through 122 shown the flowchart of FIG. 1 are sufficient to describe one implementation of the present inventive concepts, other implementations of the present inventive concepts may utilize actions different from those shown in the flowchart of FIG. 1. Moreover, structures shown in FIGS. 2 through 13 illustrate the results of performing respective actions 100 through 122 in the flowchart of FIG. 1, respectively. For example, structure 200 shows a PCM RF switch structure after performing action 100, structure 222 shows a PCM RF switch structure after performing action 122, and so forth.

Figure 2:
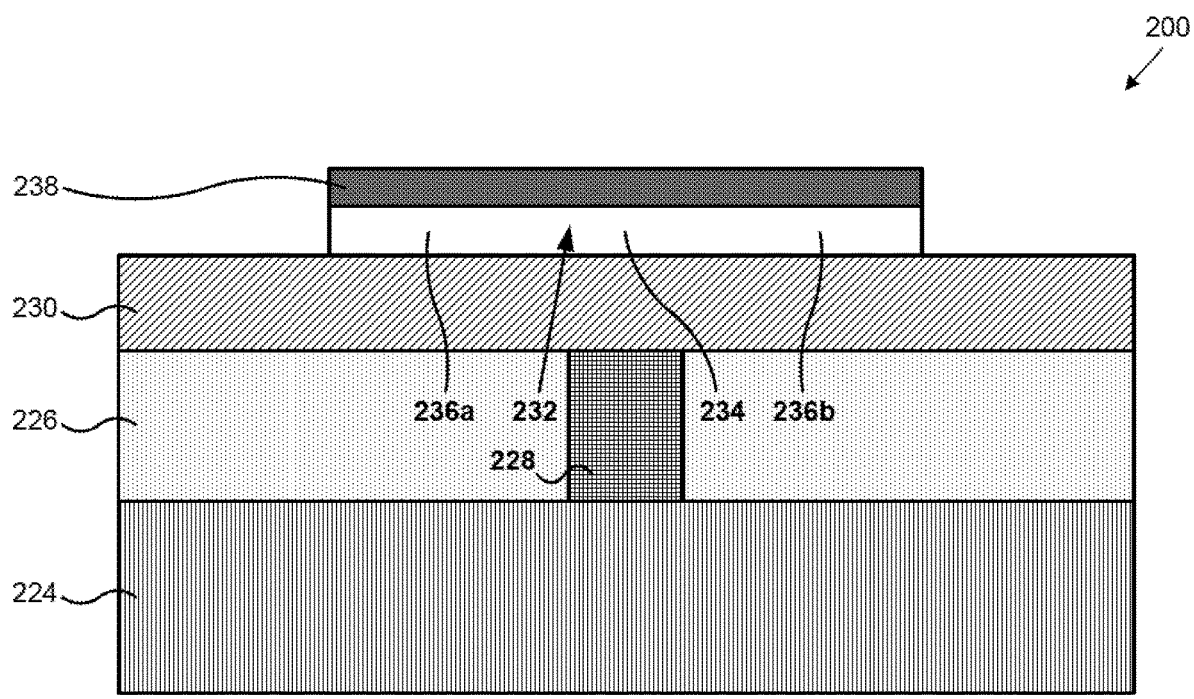
FIG. 2 illustrates a cross-sectional view of a portion of a PCM RF switch structure processed in accordance with an action in the flowchart of FIG. 1 according to one implementation of the present application.

Referring to FIG. 2, PCM RF switch structure 200 illustrates a cross-sectional view of a portion of a PCM RF switch structure processed in accordance with action 100 in the flowchart of FIG. 1 according to one implementation of the present application. As shown in FIG. 2, PCM RF switch structure 200 includes substrate 224, lower dielectric 226, heating element 228, thermally conductive and electrically insulating layer 230, PCM 232 having active segment 234 and passive segments 236a and 236b, and optional contact uniformity support layer 238. PCM RF switch structure 200 may include other structures not shown in FIG. 2.

Substrate 224 is situated under lower dielectric 226. In one implementation, substrate 224 is an insulator, such as silicon oxide ($SiO_2$). In various implementations, substrate 224 is a silicon (Si), silicon-op-insulator (SOI), sapphire, complementary metal-oxide-semiconductor (CMOS), bipolar CMOS (BiCMOS), or group substrate. In various implementations, a heat spreader is integrated with substrate 224 or substrate 224 itself performs as a heat spreader. Substrate 224 can have additional layers (not shown m FIG. 2). In one implementation, substrate 224 can comprise a plurality of interconnect metal levels and interlayer dielectric layers. Substrate 224 can also comprise a plurality of devices, such as integrated passive devices (IPDs) (pot shown in FIG. 2).

Lower dielectric 226 is situated on top of substrate 224, and is adjacent to the sides of heating element 228. In the present implementation, lower dielectric 226 extends along the width of RF switch structure 200, and is also coplanar with heating element 228. In various implementations, lower dielectric 226 can have a relative width and/or relative thickness greater or less than shown in FIG. 2. Lower dielectric 226 may comprise a material with thermal conductivity lower than that of thermally conductive and electrically insulating layer 230. In various implementations, lower dielectric 226 can comprise silicon oxide ($SiO_2$), silicon nitride ($Si_XN_Y$), or another dielectric.

Heating element 228 is situated in lower dielectric 226. Heating element 228 also underlies active segment 234 of PCM 232. Heating element 228 generates a crystallizing heat pulse or an amorphizing heat pulse for transforming active segment 234 of PCM 232. Heating element 228 can comprise any material capable of joule heating. Preferably, heating element 228 comprises a material that exhibits minimal or substantially no electromigration, thermal stress migration, and/or agglomeration. In various implementations, heating element 228 can comprise tungsten (W), molybdenum (Mo), titanium (Ti), titanium nitride (TiN), titanium tungsten (TiW), tantalum (Ta), nickel chromium (NiCr), or nickel chromium silicon (NiCrSi). For example, in one implementation, heating element 228 comprises tungsten lined with titanium and titanium nitride. Heating element 228 may be formed by a damascene process, a subtractive etch process, or any other suitable process. Heating element 228 can be connected to electrodes of a pulse generator (not shown in FIG. 2) that generates a crystallizing current pulse or an amorphizing voltage or current pulses.

Thermally conductive and electrically insulating layer 230 is situated on top of heating element 228 and lower dielectric 226, and under PCM 232 and, in particular, under active segment 234 of PCM 232. Thermally conductive and electrically insulating layer 230 ensures efficient heat transfer from heating element 228 toward active segment 234 of PCM 232, while electrically insulating heating element 228 from PCM 232, and other neighboring structures. Thermally conductive and electrically insulating layer 230 can comprise any material with high thermal conductivity and high electrical resistivity. In various implementations, thermally conductive and electrically insulating layer 230 can comprise aluminum nitride (AlN), aluminum oxide ($Al_XO_Y$), beryllium oxide ($Be_XO_Y$), silicon carbide (SiC), diamond, or diamond-like carbon.

PCM 232 is situated on top of thermally conductive and electrically insulating layer 230. PCM 232 also overlies heating element 228. PCM 232 includes active segment 234 and passive segments 236a and 236b. Active segment 234 of PCM 232 approximately overlies heating element 228 and is approximately defined by heating element 228. Passive segments 236a and 236b of PCM 232 extend outward and are transverse to heating element 228. As used herein, "active segment" refers to a segment of PCM that transforms between crystalline and amorphous states, for example, in response to a crystallizing or an amorphizing heat pulse generated by heating element 228, whereas "passive segment" refers to a segment of PCM that does make such transformation and maintains a crystalline state (i.e., maintains a conductive state). With proper heat pulses and heat dissipation, active segment 234 of PCM 232 can transform between crystalline and amorphous states, allowing RF switch structure 200 to switch between ON and OFF states respectively.

PCM 232 can be germanium telluride ($Ge_XTe_Y$), germanium antimony telluride ($Ge_XSb_YTe_Z$), germanium selenide ($Ge_XSe_Y$), or any other chalcogenide. In various implementations, PCM 232 can be germanium telluride having from forty percent to sixty percent germanium by composition (i.e., $Ge_XTe_Y$, where $0.4 \leq X \leq 0.6$ and $Y=1-X$). The material for PCM 232 can be chosen based upon ON state resistivity, OFF state electric field breakdown threshold, crystallization temperature, melting temperature, or other considerations. PCM 232 can be provided, for example, by physical vapor deposition (PVD), sputtering, chemical vapor deposition (CVD), evaporation, or atomic layer deposition (ALD). In one implementation, PCM 232 can have a thickness of approximately five hundred angstroms to approximately two thousand angstroms (500 Å-2000 Å). In other implementations, PCM 232 can have any other thicknesses. The thickness of PCM 232 can be chosen based upon sheet resistance, crystallization power, amorphization power, or other considerations. It is noted that in FIG. 2, current flowing in heating element 228 flows substantially under active segment 234 of PCM 232.

Optional contact uniformity support layer 238 is situated over PCM 232. In one implementation, optional contact uniformity support layer 238 comprises $Si_XN_Y$. In another implementation, optional contact uniformity support layer 238 is a bi-layer that comprises oxide and nitride, such as $SiO_2$ under $Si_XN_Y$. Optional contact uniformity support layer 238 can be provided, for example, by plasma enhanced CVD (PECVD) or high density plasma CVD (HDP-CVD). In one implementation, optional contact uniformity support layer 238 can have a thickness of approximately fifty angstroms to approximately one thousand two hundred and fifty angstroms (50 Å-1250 Å). By forming optional contact uniformity support layer 238 as shown in FIG. 2, PCM 232 will remain substantially intact, and uniform contact can be made to passive segments 236a and 236b of PCM 232, as described below. Optional contact uniformity support layer 238 is optional in that the inventive concepts of the present application may be implemented without forming optional contact uniformity support layer 238, as described below.

Figure 3:
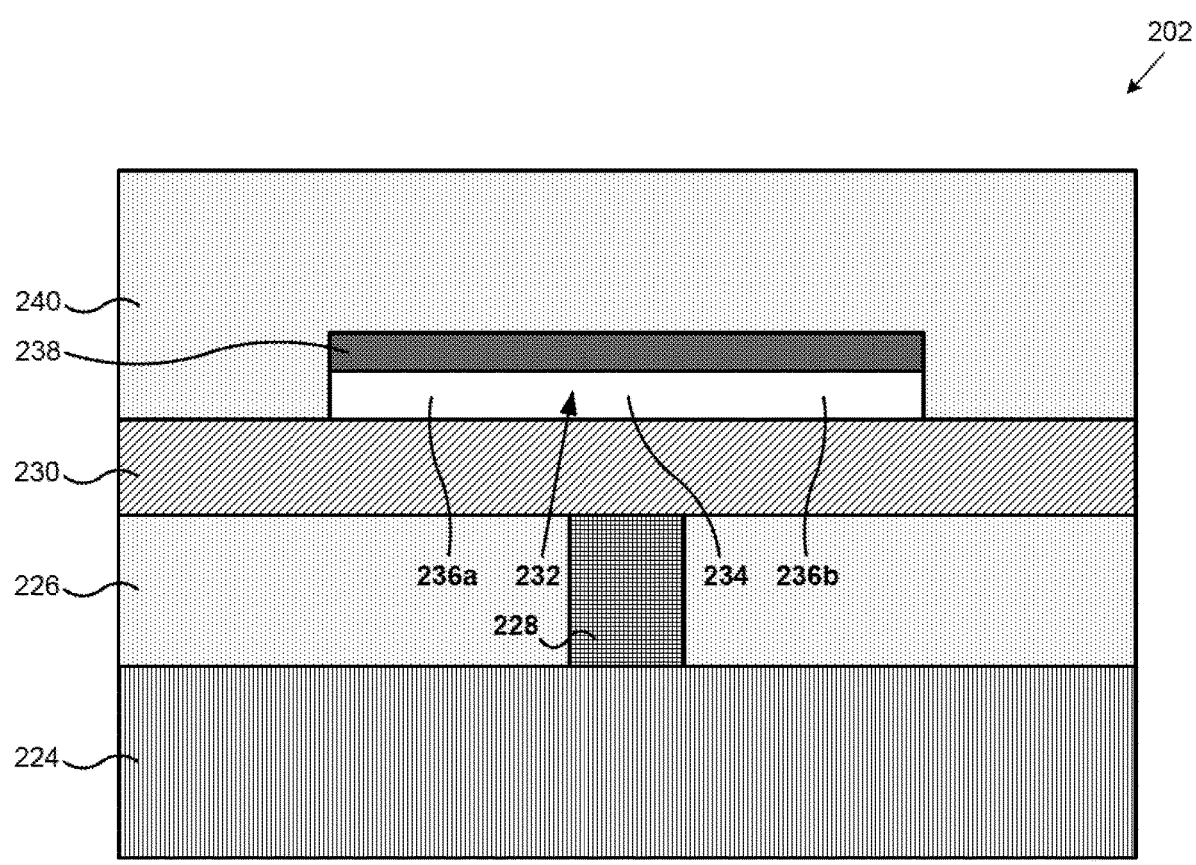
FIG. 3 illustrates a cross-sectional view of a portion of a PCM RF switch structure processed in accordance with an action in the flowchart of FIG. 1 according to one implementation of the present application.

Referring to FIG. 3, PCM RF switch structure 202 illustrates a cross-sectional view of a portion of a PCM RF switch structure processed in accordance with action 102 in the flowchart of FIG. 1 according to one implementation of the present application. As shown in FIG. 3, RF terminal dielectric 240 is formed over PCM 232 and over optional contact uniformity support layer 238 (in case optional contact uniformity support layer 238 is used). RF terminal dielectric 240 is also formed over thermally conductive and electrically insulating layer 230. In the present implementation, chemical machine polishing (CMP) is used to planarize RF terminal dielectric 240. In various implementations, RF terminal dielectric 240 is $SiO_2$, $Si_XN_Y$, or another dielectric RF terminal dielectric 240 can be formed, for example, by PECVD or HDP-CVD. In one implementation, the deposition thickness of RF terminal dielectric 240 can range from approximately one half a micron to approximately two microns (0.5 μm-2 μm). In one implementation, a thickness of RF terminal dielectric 240 is significantly greater than a thickness of optional contact uniformity support layer 238.

Figure 4:
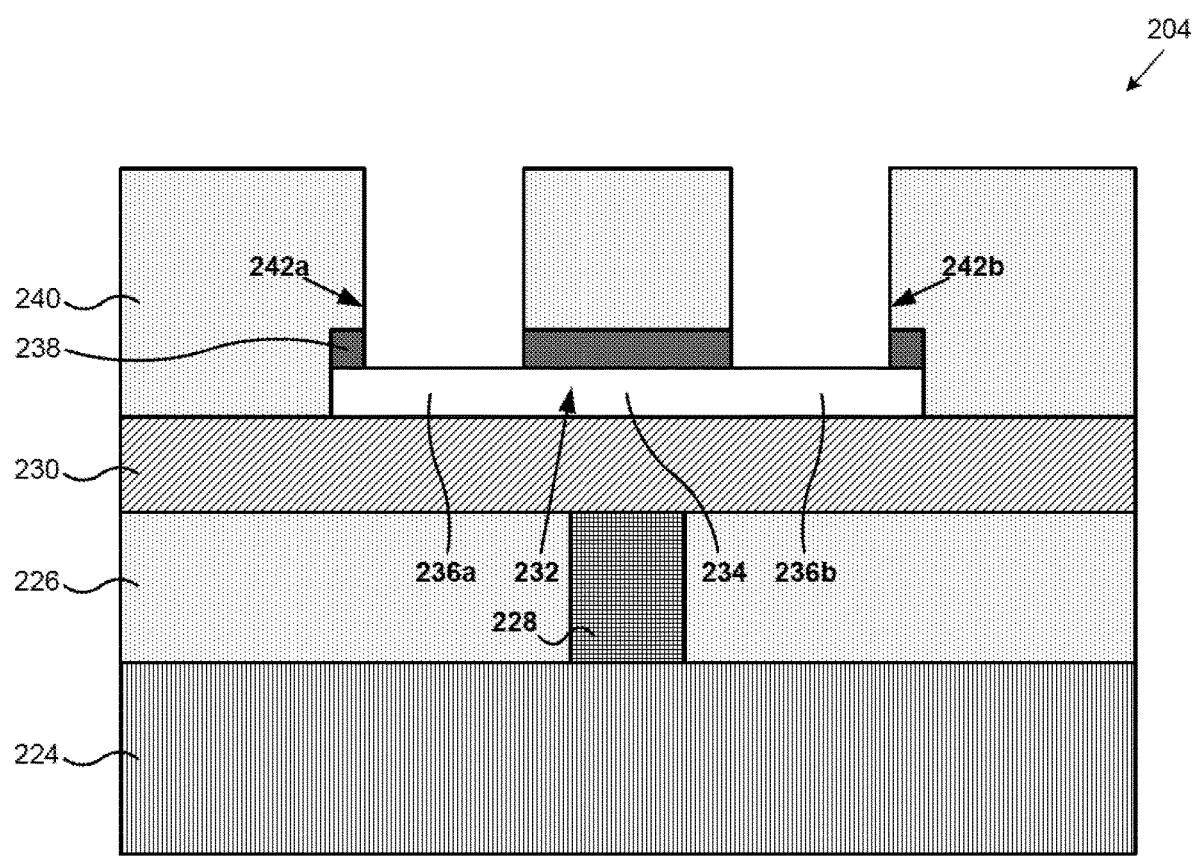
FIG. 4 illustrates a cross-sectional view of a portion of a PCM RF switch structure processed in accordance with an action in the flowchart of FIG. 1 according to one implementation of the present application.

Referring to FIG. 4, PCM RF switch structure 204 illustrates a cross-sectional view of a portion of a PCM RF switch structure processed in accordance with action 104 in the flowchart of FIG. 1 according to one implementation of the present application. As shown in FIG. 4, trenches or holes 242a and 242b are etched in RF terminal dielectric 240 and in optional contact uniformity support layer 238 (in case optional contact uniformity support layer 238 is used). Trenches or holes 242a and 242b extend to passive segment 236a and 236b respectively of PCM 232.

In the present implementation, forming trenches 242a and 242b may comprise two different etching actions. In the first etching action, RF terminal dielectric 240 can be aggressively etched without having to accurately time the etching action. This etching action can use a selective etch, for example, a fluorine-based plasma dry etch, and optional contact uniformity support layer 238 can perform as an etch stop while RF terminal dielectric 240 is selectively etched. In the second etching action, optional contact uniformity support layer 238 is punch-through etched. As used herein, "punch-through" refers to a short etching action that can be accurately timed to stop at the top surface of PCM 232. In RF switch structure 204, trenches 242a and 242b are narrow and optional contact uniformity support layer 238 is thin. Thus, only a small volume of optional contact uniformity support layer 238 is etched, and the punch-through etching action is short and can be accurately timed. In one implementation, a chlorine-based plasma dry etch is used for this etching action.

Optional contact uniformity support layer 238 is optional in that the inventive concepts of the present application may be implemented without optional contact uniformity support layer 238, and trenches 242a and 242b can extend through RF terminal dielectric 240 into PCM 232. Because the ON state resistance ($R_{ON}$) of an RF switch depends heavily on the uniformity of contact made with PCM 232, the $R_{ON}$ will be significantly lower when optional contact uniformity support layer 238 is used.

Figure 5:
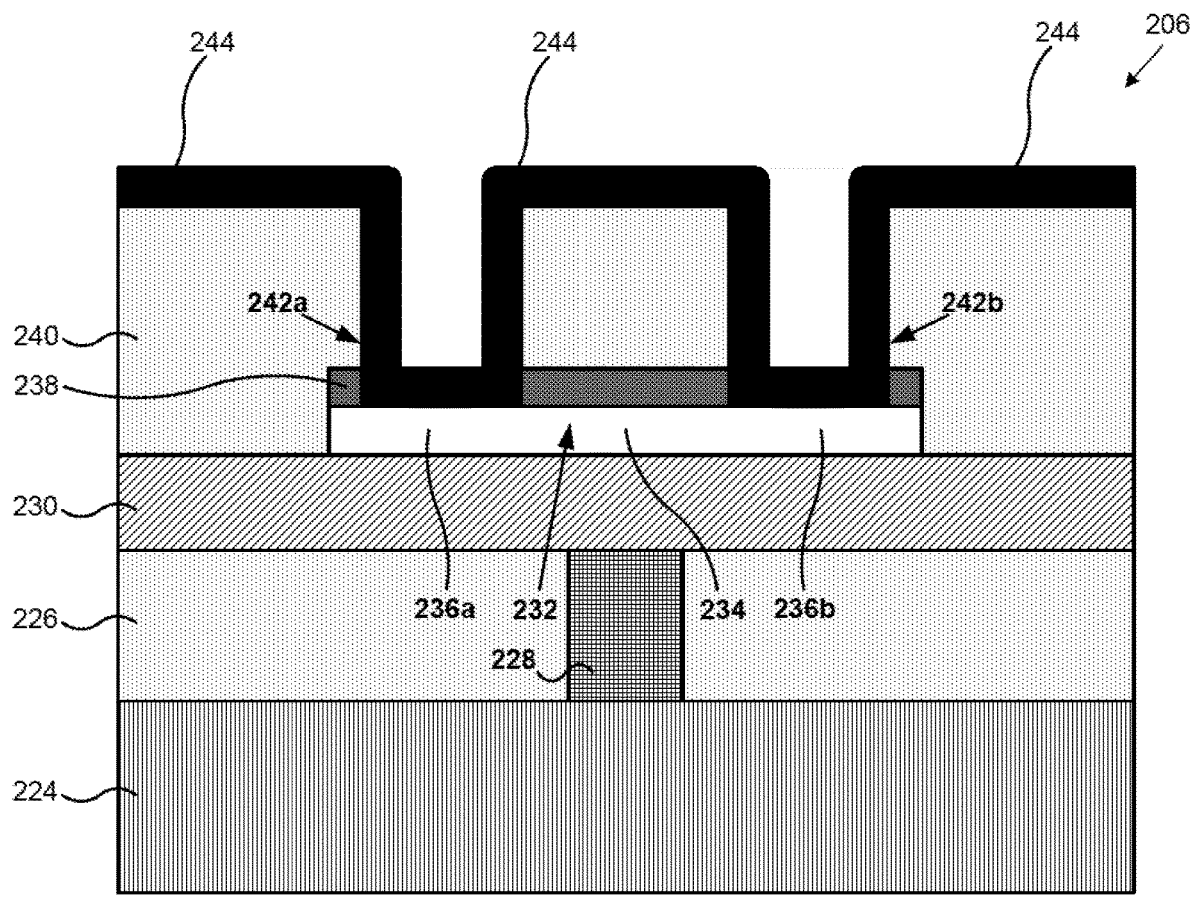
FIG. 5 illustrates a cross-sectional view of a portion of a PCM RF switch structure processed in accordance with an action in the flowchart of FIG. 1 according to one implementation of the present application.

Referring to FIG. 5, PCM RF switch structure 206 illustrates a cross-sectional view of a portion of a PCM RF switch structure processed in accordance with action 106 in the flowchart of FIG. 1 according to one implementation of the present application. As shown in FIG. 5, metal liner 244 is formed in trenches 242a and 242b, and on passive segments 236a and 236b of PCM 232. Metal liner 244 lines trenches 242a and 242b without completely filling trenches 242a and 242b. Metal liner 244 is also formed over RF terminal dielectric 240. In various implementations, metal liner 244 can comprise tungsten (W), molybdenum (Mo), titanium (Ti), titanium nitride (TiN), titanium tungsten (TiW), tantalum (Ta), cobalt (Co), nickel (Ni), nickel chromium (NiCr), or nickel chromium silicon (NiCrSi). For example, in one implementation, metal liner 244 comprises cobalt lined with titanium nitride and tungsten. Metal liner 244 may be formed by PVD, CVD, or any other suitable process.

Figure 6:
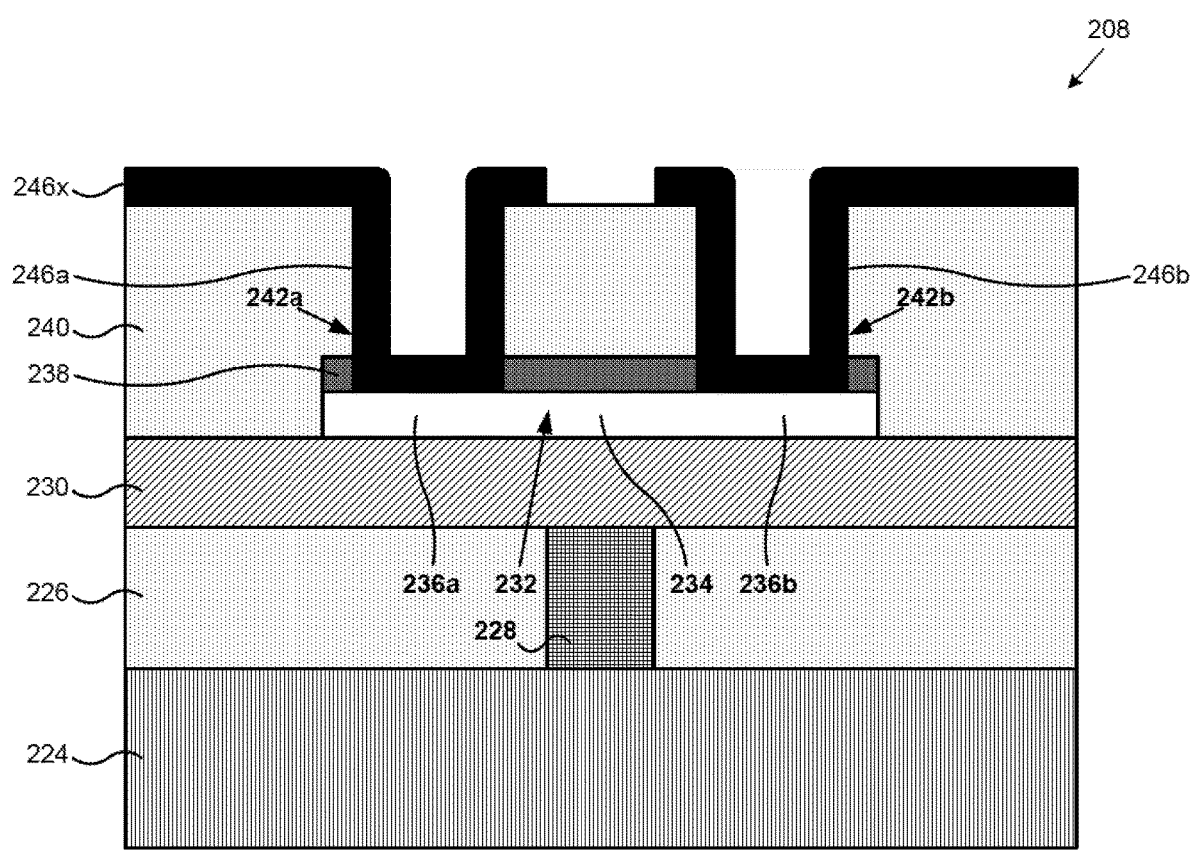
FIG. 6 illustrates a cross-sectional view of a portion of a PCM RF switch structure processed in accordance with an action in the flowchart of FIG. 1 according to one implementation of the present application.

Referring to FIG. 6, PCM RF switch structure 208 illustrates a cross-sectional view of a portion of a PCM RF switch structure processed in accordance with action 108 in the flowchart of FIG. 1 according to one implementation of the present application. As shown in FIG. 6, trench metal liners 246a and 246b are formed in trenches 242a and 242b respectively and on passive segments 236a and 236b respectively of PCM 232. Thus, trench metal liners 246a and 246b are ohmically connected to passive segments 236a and 236b respectively of PCM 232. In the present implementation, trench metal liners 246a and 246b are formed by removing a middle segment of metal liner 244 (shown in FIG. 5) on RF terminal dielectric 240 between trenches 242a and 242b, for example, using a chlorine based reactive ion etch (RIE). Outside trench 242a, trench metal liner extension 246x is situated over RF terminal dielectric 240 and integrally connected to trench metal liner 246a.

Figure 7:
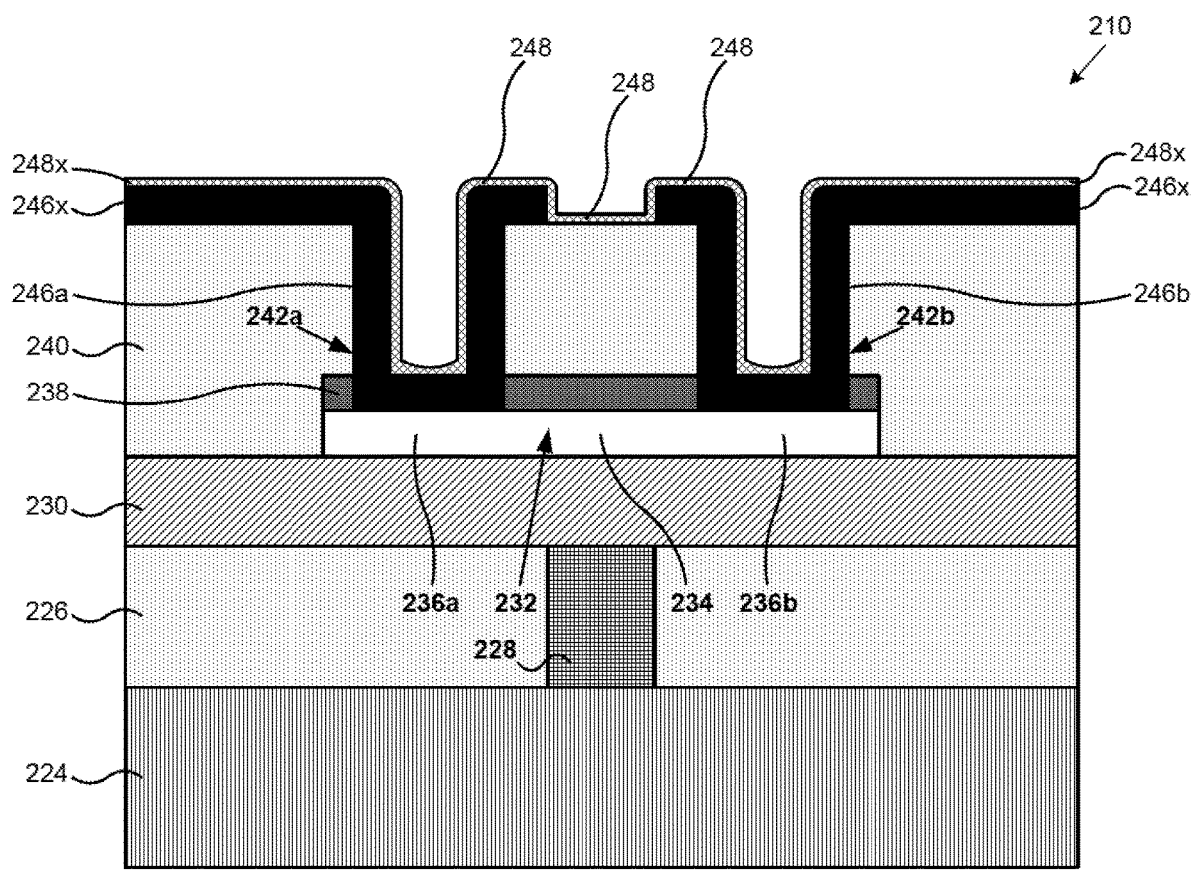
FIG. 7 illustrates a cross-sectional view of a portion of a PCM RF switch structure processed in accordance with an action in the flowchart of FIG. 1 according to one implementation of the present application.

Referring to FIG. 7, PCM RF switch structure 210 illustrates a cross-sectional view of a portion of a PCM RF switch structure processed in accordance with action 110 in the flowchart of FIG. 1 according to one implementation of the present application. As shown in FIG. 7, dielectric liner 248 is formed on trench metal liners 246a and 246b in trenches 242a and 242b. Dielectric liner 248 is also formed on trench metal liner extension 246x and on RF terminal dielectric 240. Dielectric liner 248 lines trench metal liners 246a and 246b. In one implementation, dielectric liner 248 is silicon nitride. In various implementations, dielectric liner 248 is a high-k dielectric, such as tantalum pentoxide, aluminum oxide, hafnium oxide, zirconium oxide, zirconium aluminum silicate, hafnium silicate, hafnium aluminum silicate or another dielectric with a relatively high dielectric constant. In one implementation, the thickness of dielectric liner 248 can range from approximately two hundred angstroms to approximately six hundred angstroms (200 Å-600 Å). As further shown in FIG. 7, dielectric liner extension 248x is situated over trench metal liner extension 246x and integrally connected to dielectric liner 248.

Figure 8:
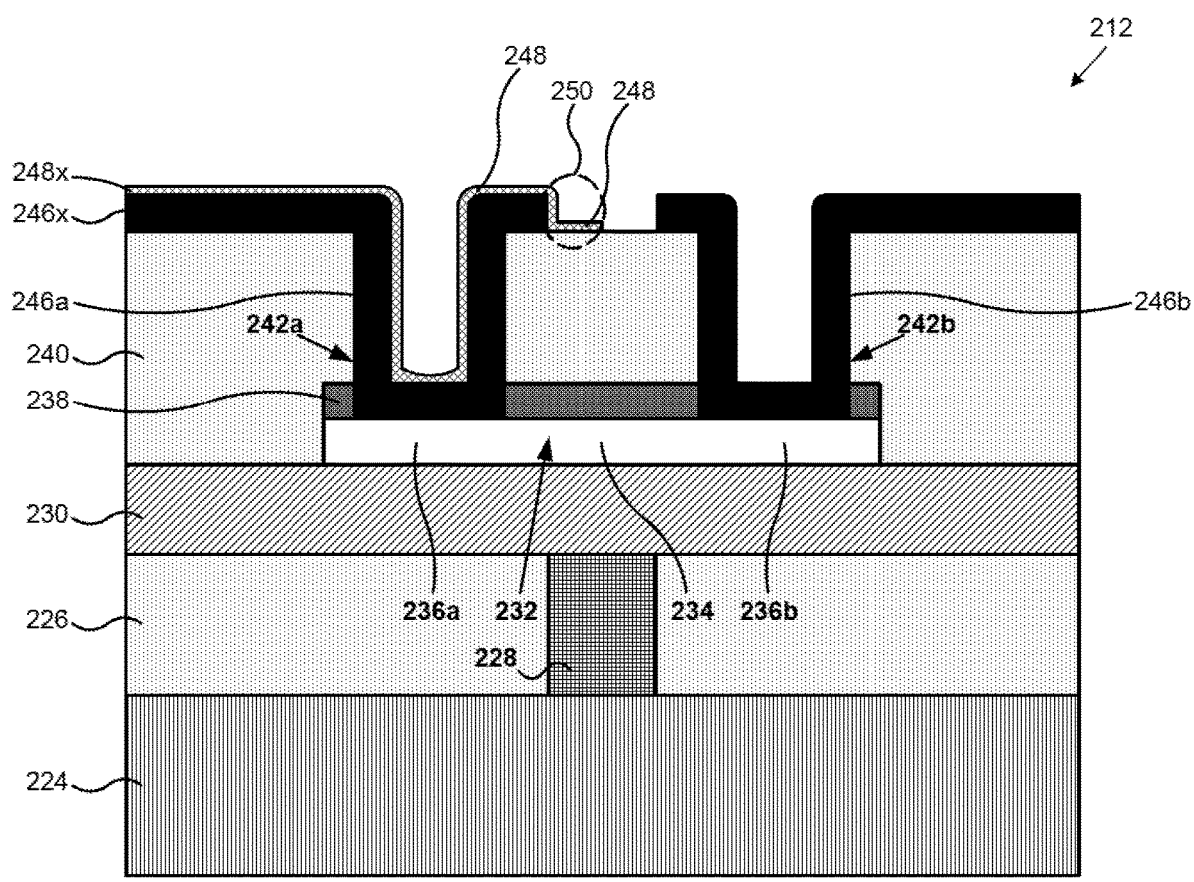
FIG. 8 illustrates a cross-sectional view of a portion of a PCM RF switch structure processed ill accordance with an action in the flowchart of FIG. 1 according to one implementation of the present application.

Referring to FIG. 8, PCM RF switch structure 212 illustrates a cross-sectional view of a portion of a PCM RE switch structure processed in accordance with action 112 in the flowchart of FIG. 1 according to one implementation of the present application. As shown in FIG. 8, dielectric liner 248 is removed from trench metal liner 246b. In one implementation, a fluorine based RIE is used to remove dielectric liner 248 from trench metal liner 246b. Dielectric liner 248 remains on trench metal liner 246a. Notably, dielectric liner 248 remains with overplot 250 relative to trench metal liner 246a. Overplot 250 protects against shorting, as described below. Outside trench 242a, dielectric liner extension 248x is situated over trench metal liner extension 246x and integrally connected to dielectric liner 248.

Figure 9:
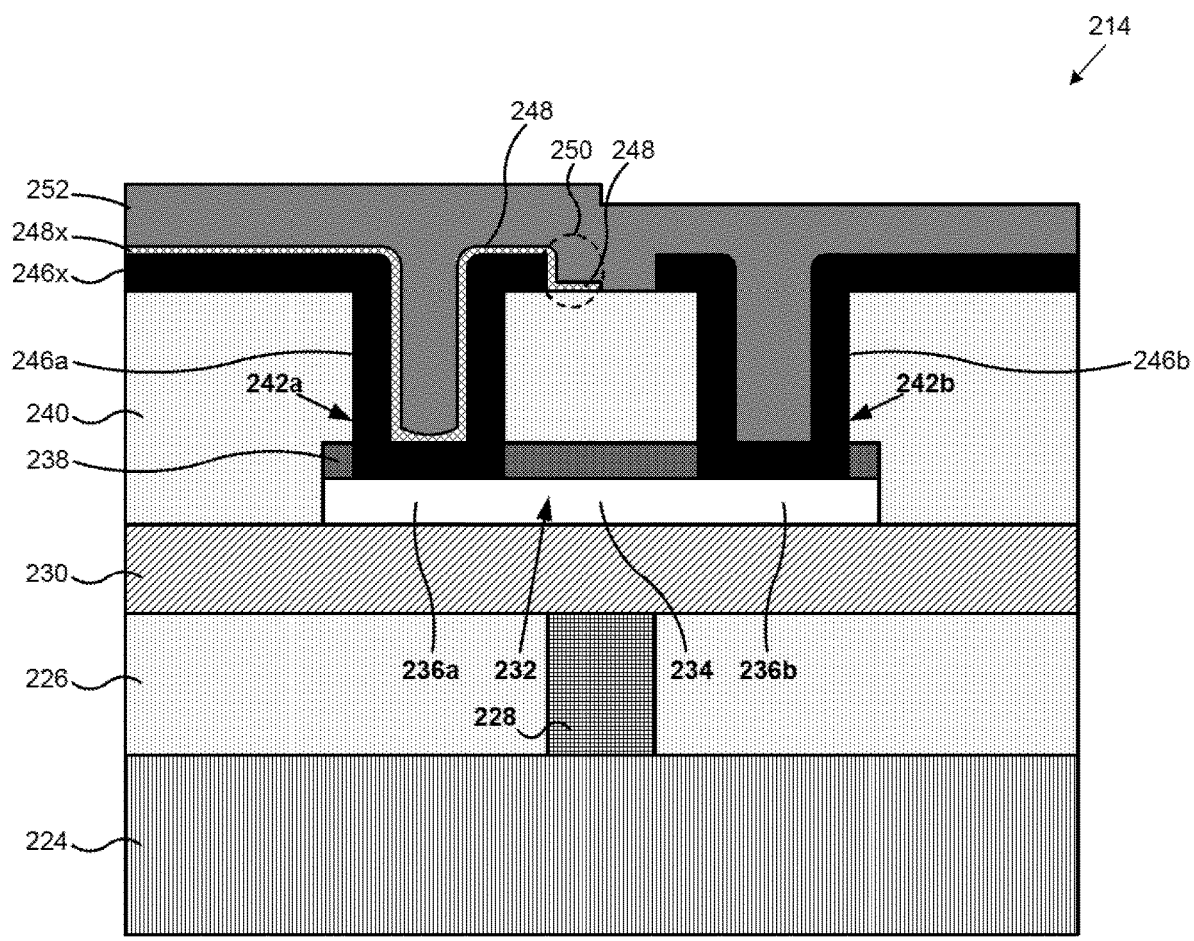
FIG. 9 illustrates a cross-sectional view of a portion of a PCM RF switch structure processed in accordance with an action in the flowchart of FIG. 1 according to one implementation of the present application.

Referring to FIG. 9, PCM RF switch structure 214 illustrates a cross-sectional view of a portion of a PCM RF switch structure processed in accordance with action 114 in the flowchart of FIG. 1 according to one implementation of the present application. As shown in FIG. 9, metal 252 is deposited on dielectric liner 248 in trench 242a, and on trench metal liner 246b in trench 242b. Metal 252 fills trenches 242a and 242b. In various implementations, metal 252 can comprise aluminum (Al), copper (Cu), titanium (Ti), or titanium nitride (TiN). For example, in one implementation, metal 252 comprises a sequential stack of titanium, titanium nitride, aluminum, titanium, and titanium nitride. Metal 252 can be formed by PVD, or any other suitable process. In one implementation, the deposition thickness of metal 252 can be approximately care half a micron (0.5 μm).

Figure 10:
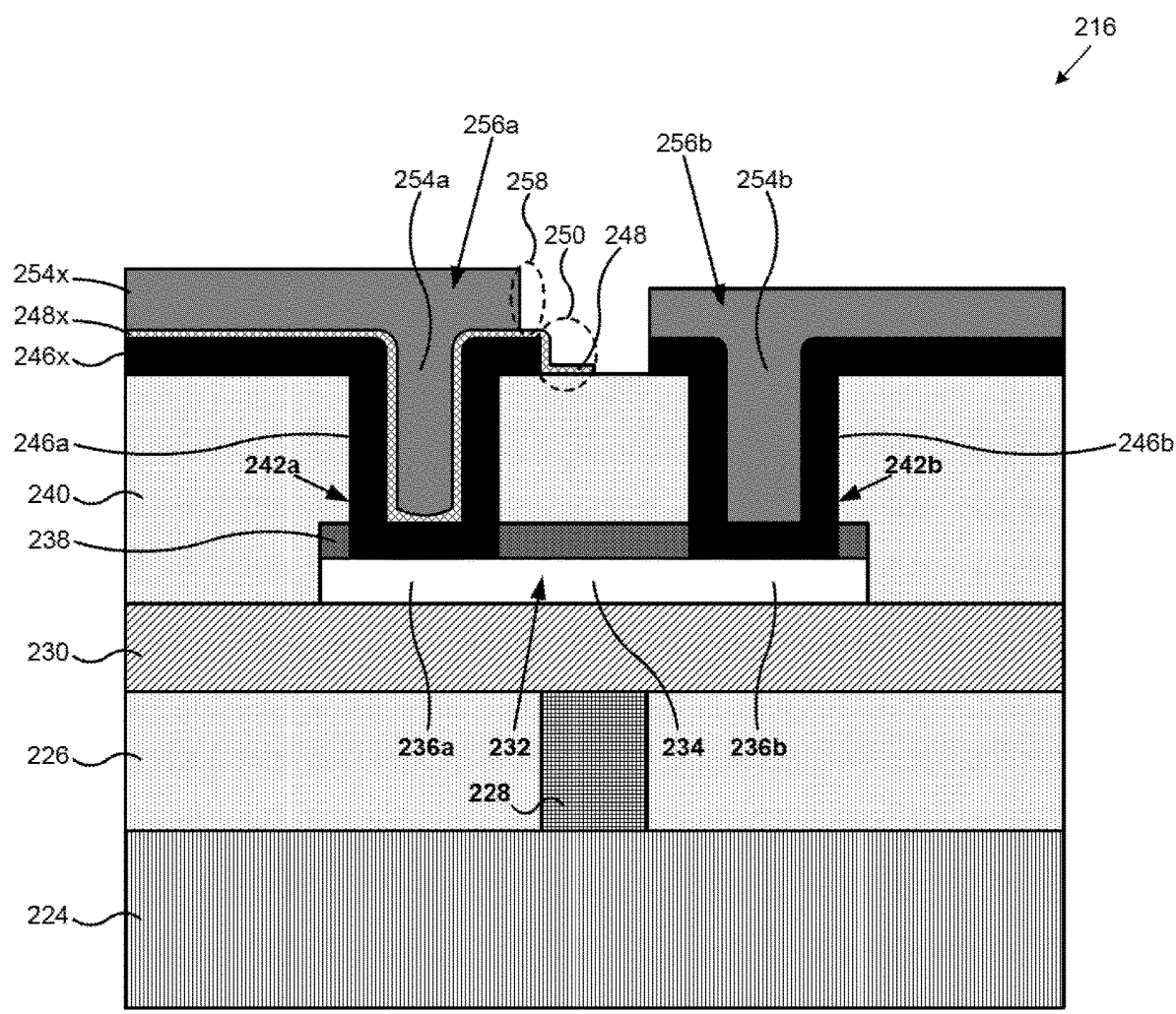
FIG. 10 illustrates a cross-sectional view of a portion of a PCM RF switch structure processed in accordance with an action in the flowchart of FIG. 1 according to one implementation of the present application.

Referring to FIG. 10, PCM RF switch structure 216 illustrates a cross-sectional view of a portion of a PCM RF switch structure processed in accordance with action 116 in the flowchart of FIG. 1 according to one implementation of the present application. As shown in FIG. 10, trench metal plug 254a is formed in trench 242a on dielectric liner 248, and trench metal plug 254b and is formed in trench 242b on trench metal liner 246b, thereby substantially completing capacitive RF terminal 256a and ohmic RF terminal 256b of PCM RF switch structure 216. Capacitive RF terminal 256a and ohmic RF terminal 256b provide RF signals to/from passive segments 236a and 236b respectively of PCM 232. Capacitive RF terminal 256a includes trench metal liner 246a, dielectric liner 248, and trench metal plug 254a that together form a trench capacitor. Dielectric liner 248 separates trench metal liner 246a from trench metal plug 254a. As such, trench metal liner 246a is ohmically separated from, but capacitively coupled to trench metal plug 254a. Ohmic RF terminal 256b includes trench metal liner 246b) and trench metal plug 254b. Unlike trench metal liner 246a and trench metal plug 254a of capacitive RF terminal 256a, trench metal liner 246b and trench metal plug 254b of ohmic RF terminal 256b are ohmically coupled.

Capacitive RF terminal 256a also includes trench metal liner extension 246x, dielectric liner extension 248x, and trench metal plug extension 254x that further capacitively couple trench metal liner 246a to trench metal plug 254a. Trench metal liner extension 246x, dielectric liner extension 248x, and trench metal plug extension 254x are optional in that the inventive concepts of the present application may be implemented without them, and trench metal liner 246a would still capacitively couple to trench metal plug 254a. However, capacitive coupling between trench metal liner 246a and trench metal plug 254a is strengthened when trench metal liner extension 246x, dielectric liner extension 248x, and trench metal plug extension 254x are used. Although trench metal liner 246a, dielectric liner 248, and trench metal plug 254a are illustrated as integrally formed with trench metal liner extension 246x, dielectric liner extension 248x, and trench metal plug extension 254x respectively, in one implementation they may be different formations. For example, trench metal plug 254a may be situated in trench 242a and a metal may be subsequently formed over trench metal plug 254a to form trench metal plug extension 254x. In this example, trench metal plug 254a can comprise W, and trench metal plug extension 254x can comprise Al or Cu.

In the present implementation, trench metal plugs 254a and 254b are formed by removing a middle segment of metal 252 (shown in FIG. 9) between trenches 242a and 242b, for example, using a metal etch. Notably, dielectric liner 248 remains with underplot 258 relative to trench metal liner 246a. Underplot 258 protects against breakdown, as described below. Outside trench 242a, trench metal plug extension 254x is situated over dielectric liner extension 248x and integrally connected to trench metal plug 254a.

Figure 11:
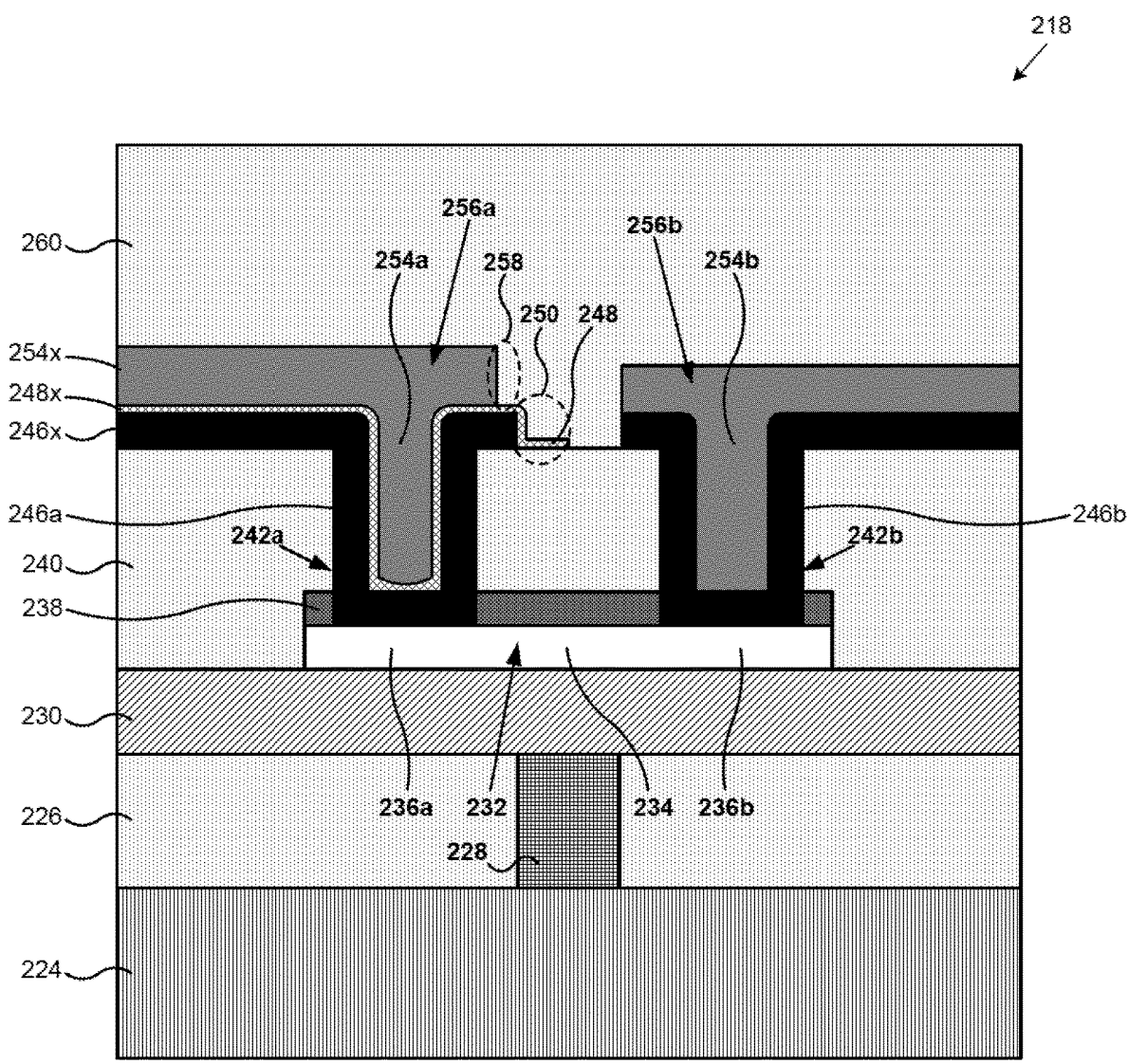
FIG. 11 illustrates a cross-sectional view of a portion of a PCM RF switch structure processed in accordance with an action in the flowchart of FIG. 1 according to one implementation of the present application.

Referring to FIG. 11, PCM RF switch structure 218 illustrates a cross-sectional view of a portion of a PCM RF switch structure processed in accordance with action 118 in the flowchart of FIG. 1 according to one implementation of the present application. As shown in FIG. 11, interlayer dielectric 260 is formed over trench metal plugs 254a and 254b. In the present implementation, CMP is used to planarize interlayer dielectric 260. Interlayer dielectric 260 provides insulation between trench metal plugs 254a and 254b and subsequently formed vias or interconnect metal (not shown in FIG. 11). In various implementations, interlayer dielectric 260 is $SiO_2$, $Si_xN_y$, or another dielectric. Interlayer dielectric 260 can be formed, for example, by PECVD or HDP-CVD. In one implementation, the deposition thickness of RF terminal dielectric 240 can be approximately one half a micron (0.5 µm).

Figure 12:
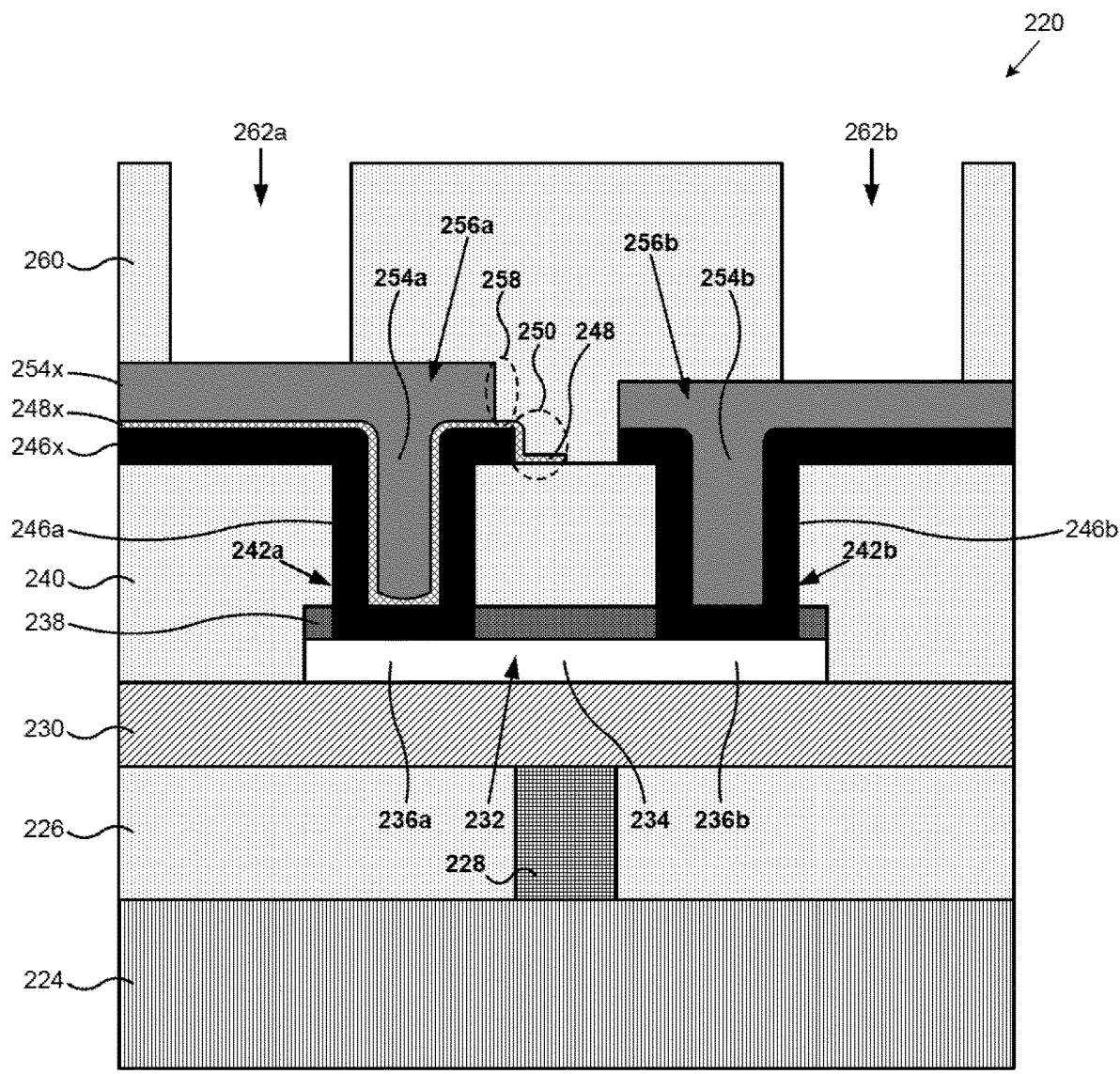
FIG. 12 illustrates a cross-sectional view of a portion of a PCM RF switch structure processed ill accordance with an action in the flowchart of FIG. 1 according to one implementation of the present application.

Referring to FIG. 12, PCM RF switch structure 220 illustrates a cross-sectional view of a portion of a PCM RF switch structure processed in accordance with action 120 in the flowchart of FIG. 1 according to one implementation of the present application. As shown in FIG. 12, interconnect holes 262a and 262b are etched in interlayer dielectric 260. Interconnect holes 262a and 262b extend to trench metal plugs 254a and 254b respectively. In the present implementation, trench metal plug 254b of ohmic RF terminal 256b is situated lower in PCM RF switch structure 220 relative to trench metal plug 254a of capacitive RF terminal 256a, and interconnect hole 262b is deeper than interconnect hole 262a because capacitive RF terminal 256a includes dielectric liner 248. Interconnect holes 262a and 262b in interlayer dielectric 260 are selectively etched so that trench metal plug 254a of capacitive RF terminal 256a remains substantially undamaged while deeper interconnect hole 262b is etched.

Figure 13:
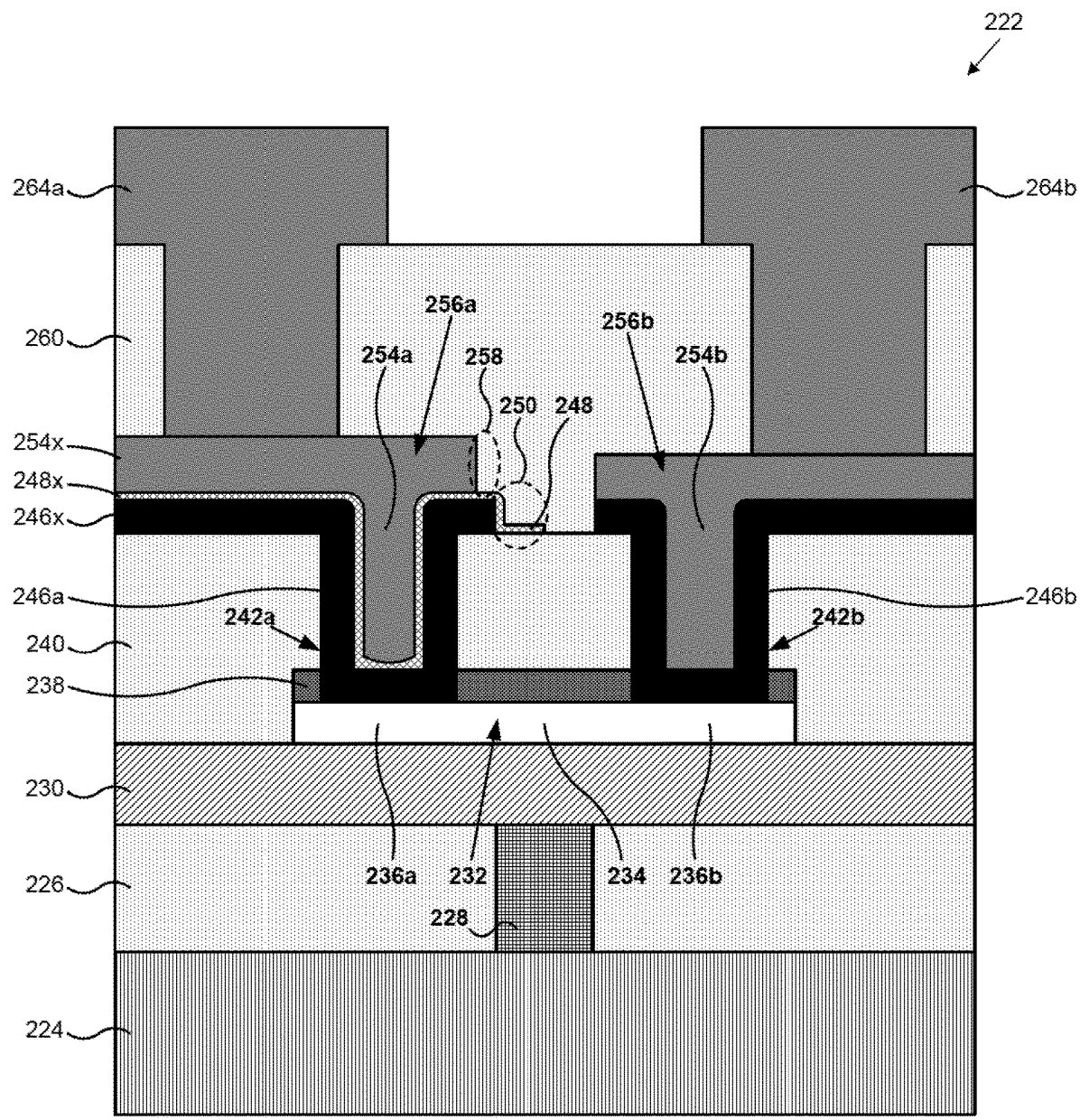
FIG. 13 illustrates a cross-sectional view of a portion of a PCM RF switch structure processed in accordance with an action in the flowchart of FIG. 1 according to one implementation of the present application.

Referring to FIG. 13, PCM RF switch structure 222 illustrates a cross-sectional view of a portion of a PCM RF switch structure processed in accordance with action 122 in the flowchart of FIG. 1 according to one implementation of the present application. As shown in FIG. 13, interconnect metals 264a and 264b are formed in interconnect holes 262a and 262b (labeled in FIG. 12) respectively and on trench metal plugs 254a and 254b) respectively. In one implementation, a metal layer is deposited over interlayer dielectric 260 and in interconnect holes 262a and 262b (labeled in FIG. 12) over trench metal plugs 254a and 254b, and then a middle segment thereof between interconnect holes 262a and 262b (labeled in FIG. 12) is etched, thereby forming interconnect metals 264a and 264b. Interconnect metals 264a and 264b can be part of routing interconnects for routing electrical signals between capacitive RF terminal 256a or ohmic RF terminal 256b and various devices (not shown in FIG. 13) that may exist independent of PCM RF switch structure 222. In various implementations, interconnect metals 264a and 264b can comprise Al and/or Cu. Interconnect metals 264a and 264b can be formed by PVD, or any other suitable process. In one implementation, the thickness of interconnect metals 264a and 264b can be approximately three microns (3 µm). In various implementations, PCM RF switch structure 222 can include more interconnect metals and/or more interlayer dielectrics than those shown in FIG. 13.

PCM RF switch structure 222 in FIG. 13 including one capacitive RF terminal 256a and one ohmic RF terminal 256b, and manufactured according to the flowchart in FIG. 1, provides several advantages. First, the trench capacitor of capacitive RF terminal 256a capacitively couples trench metal liner 246a to trench metal plug 254a, creating part of an RF signal path of PCM RF switch structure 222, despite that patterned trench metal liner 246a and trench metal plug 254a are ohmically separated from each other. Second, because capacitive RF terminal 256a is directly connected to PCM 232 without any traces or interconnects, such as interconnect metals 264a and 264b intervening therebetween, routing resistance is lowered and the quality factor of the trench capacitor is high. Third, because PCM RF switch structure 222 in FIG. 13 includes one capacitive RF terminal 256a and one ohmic RF terminal 256b, two capacitive terminals are not placed in series in the RF signal path, and thus, do not halve the total capacitance of the switch. Fourth, compared to a manufacturing process that forms two capacitive RF terminals, a manufacturing process of the present application needs only a few additional steps to form one capacitive RF terminal 256a and one ohmic RF terminal 256b.

Fifth, overplot 250 of dielectric liner 248 protects capacitive RF terminal 256a against shorting A natural result of etching metal 252 (shown in FIG. 9) to form trench metal plugs 254a and 254b shown in FIG. 10) is that stringers will form at an edge of trench metal plug 254a and undesirably short to trench metal liner 246a, which would result in "capacitive" RF terminal 256a not forming a capacitor. Overplot 250 of dielectric liner 248 intervenes between the edge of trench metal plug 254a and trench metal liner 246a. Because dielectric liner 248 provides electrical insulation, a stringer would not couple to trench metal liner 246a and would not cause a short.

Sixth, underplot 258 of trench metal plug 254a protects capacitive RF terminal 256a against breakdown. Dielectric liner 248 usually exhibits some defects or abnormalities near the sharp corner at the edge of trench metal liner 246a, which would undesirably result in breakdown variations for the trench capacitor of capacitive RF terminal 256a. Underplot 258 of trench metal plug 254a ensures that trench metal plug 254a is not situated over a sharp corner of dielectric liner 248. As such, breakdown of capacitive RF terminal 256a is more precisely controlled, and PCM RF switch structure 222 is more reliable.

Seventh, because PCM RF switch structure 222 utilizes trench metal liners 246a and 246b and trench metal plugs 254a and 254b in trenches 242a and 242b, more interface area is available to capacitively couple, and capacitance value of capacitive RF terminal 256a is increased. Eighth, because PCM RF switch structure 222 utilizes a thin high-k dielectric liner 248, the capacitive coupling between trench metal liner 246a and trench metal plug 254a is significantly increased. Ninth, because PCM RF switch structure 222 utilizes overhang regions, capacitive coupling between trench metal liner 246a and trench metal plug 254a is further increased.

Figure 14:
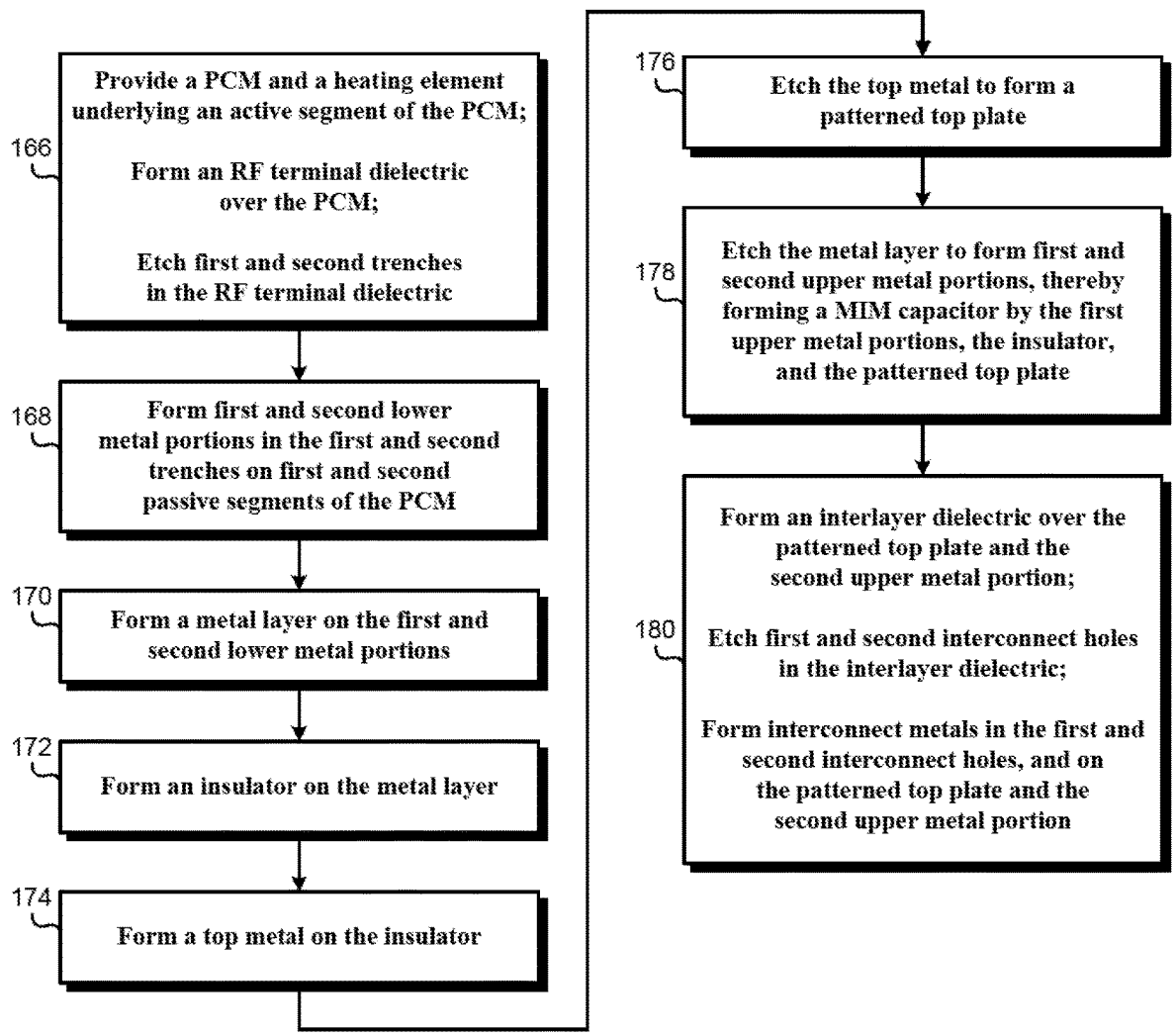
FIG. 14 illustrates a portion of a flowchart of an exemplary method for concurrently manufacturing both a capacitive RF terminal and an ohmic RF terminal in a PCM RF switch according to one implementation of the present application.

FIG. 14 illustrates a portion of a flowchart of an exemplary method for concurrently manufacturing both a capacitive RF terminal and an ohmic RF terminal in a PCM RF switch according to one implementation of the present application. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions. Actions 166 through 180 shown in the flowchart of FIG. 14 are sufficient to describe one implementation of the present inventive concepts, other implementations of the present inventive concepts may utilize actions different from those shown in the flowchart of FIG. 14. Moreover, structures shown in FIGS. 15 through 22 illustrate the results of performing respective actions 166 through 180 in the flowchart of FIG. 14, respectively. For example, structure 266 shows a PCM RF switch structure after performing action 166, structure 280 shows a PCM RF switch structure after performing action 180, and so forth.

Figure 15:
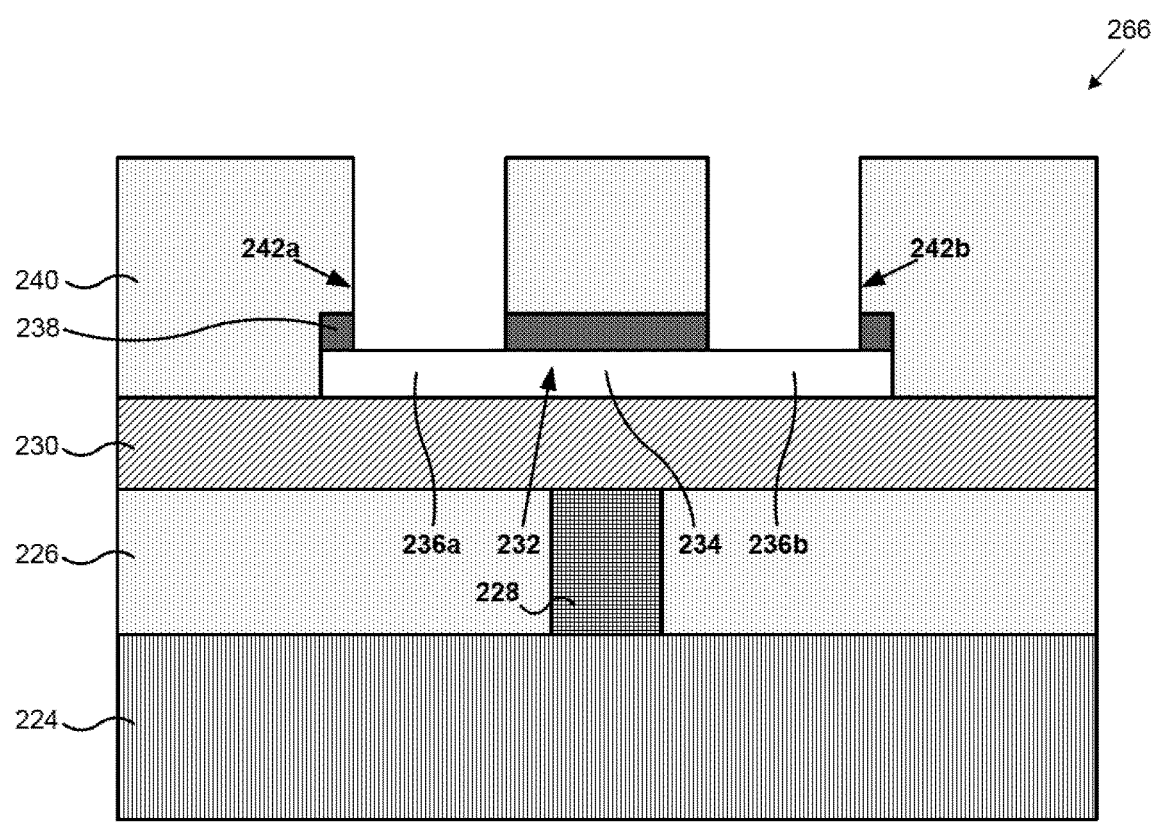
FIG. 15 illustrates a cross-sectional view of a portion of a PCM RF switch structure processed in accordance with an action in the flowchart of FIG. 14 according to one implementation of the present application.

Referring to FIG. 15, PCM RF switch structure 266 illustrates a cross-sectional view of a portion of a PCM RF switch structure processed in accordance with action 166 in the flowchart of FIG. 14 according to one implementation of the present application. As shown in FIG. 15, PCM RF switch structure 266 includes substrate 224, lower dielectric 226, heating element 228, thermally conductive and electrically insulating layer 230, PCM 232 having active segment 234 and passive segments 236a and 236b, optional contact uniformity support layer 238, RF terminal dielectric 240, and trenches 242a and 242b. Action 166 in the flowchart of FIG. 14 generally corresponds to actions 100, 102, and 104 in the flowchart of FIG. 1. Accordingly, PCM RF switch structure 266 in FIG. 15 generally corresponds to PCM RF switch structure 204 in FIG. 4, and may have any implementations and advantages described above.

Figure 16:
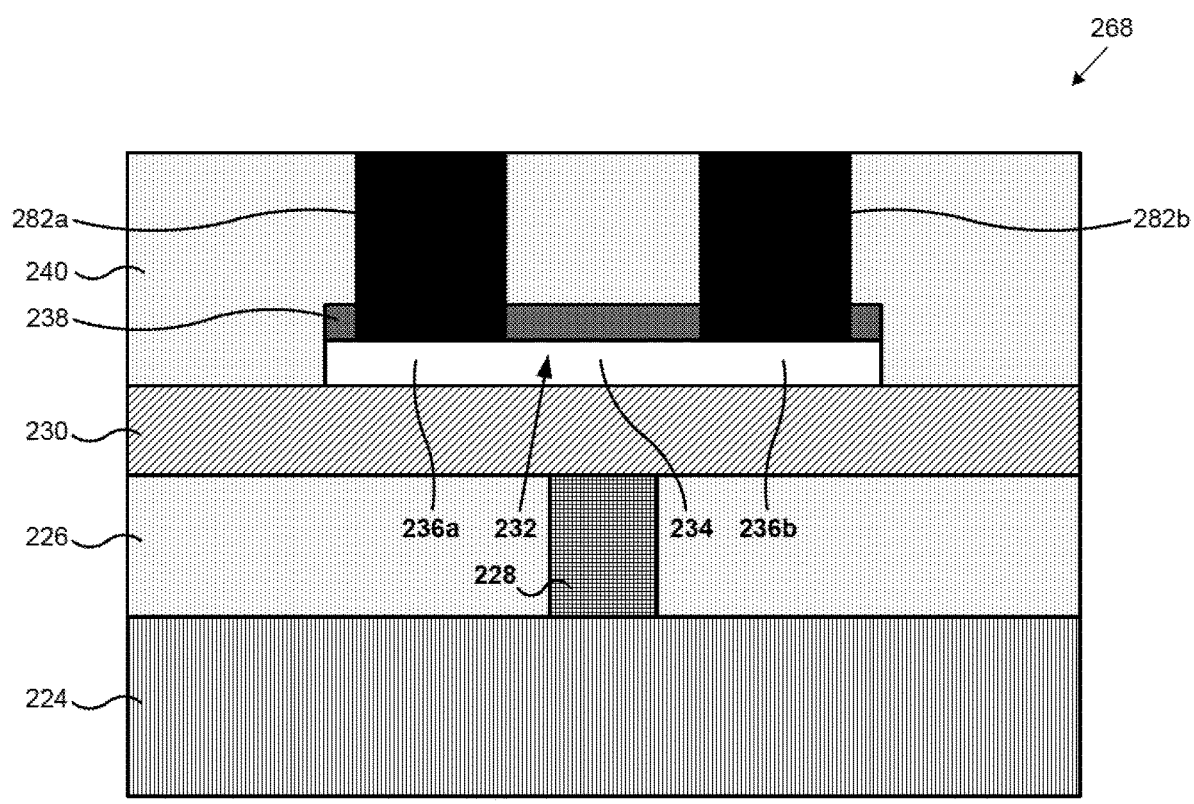
FIG. 16 illustrates a cross-sectional view of a portion of a PCM RF switch structure processed in accordance with an action in the flowchart of FIG. 14 according to one implementation of the present application.

Referring to FIG. 16, PCM RF switch structure 268 illustrates a cross-sectional view of a portion of a PCM RF switch structure processed in accordance with action 168 in the flowchart of FIG. 14 according to one implementation of the present application. As shown in FIG. 16, lower metal portions 282a and 282b are formed in trenches 242a and 242b (shown in FIG. 15), and on passive segments 236a and 236b of PCM 232. Thus, lower metal portions 282a and 282b are ohmically connected to passive segments 236a and 236b respectively of PCM 232. Notably, lower metal portions 282a and 282b fill trenches 242a and 242b. In one implementation, lower metal portions 282a and 282b can be formed by depositing a metal, for example, using PVD, CVD, or any other suitable process, and then polishing the metal, for example, using CMP. In another implementation, lower metal portions 282a and 282b can be formed by a damascene process. In various implementations, lower metal portions 282a and 282b can comprise tungsten (W), aluminum (Al), copper (Cu), molybdenum (Mo), titanium (Ti), titanium nitride (TiN), titanium tungsten (TiW), tantalum (Ta), cobalt (Co), nickel (Ni), nickel chromium (NiCr), or nickel chromium silicon (NiCrSi).

Figure 17:
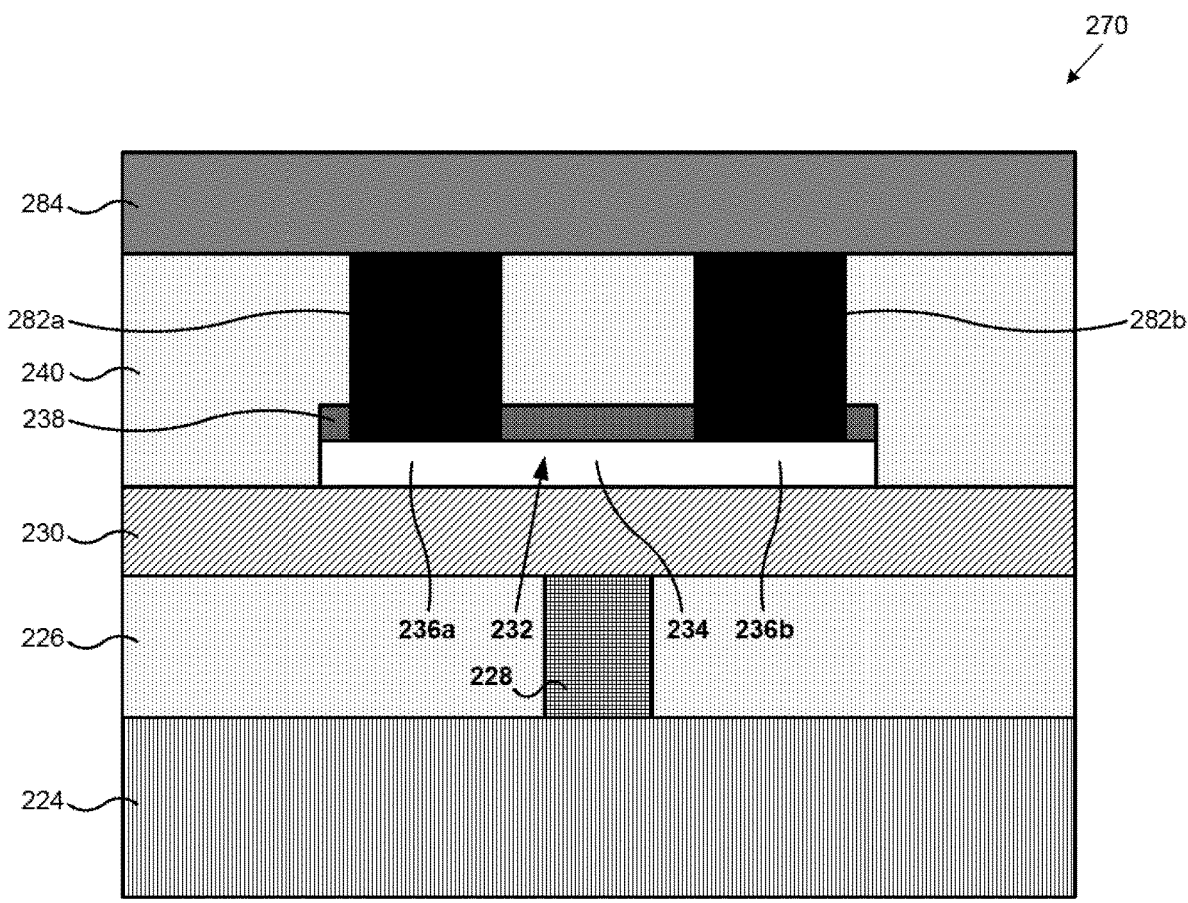
FIG. 17 illustrates a cross-sectional view of a portion of a PCM RF switch structure processed in accordance with an action in the flowchart of FIG. 14 according to one implementation of the present application.

Referring to FIG. 17, PCM RF switch structure 270 illustrates a cross-sectional view of a portion of a PCM RF switch structure processed in accordance with action 170 in the flowchart of FIG. 14 according to one implementation of the present application. As shown in FIG. 17, metal layer 284 is formed on lower metal portions 282a and 282b, and on RF terminal dielectric 240. In various implementations, metal layer 284 can comprise aluminum (Al), copper (Cu), titanium (Ti), or titanium nitride (TiN). For example, in one implementation, metal layer 284 comprises a sequential stack of titanium, titanium nitride, aluminum, titanium, and titanium nitride. In the present implementation, metal layer 284 is substantially planar. Metal layer 284 can be formed by PVD, or any other suitable process. In one implementation, the thickness of metal layer 284 can be approximately one half a micron (0.5 μm).

Figure 18:
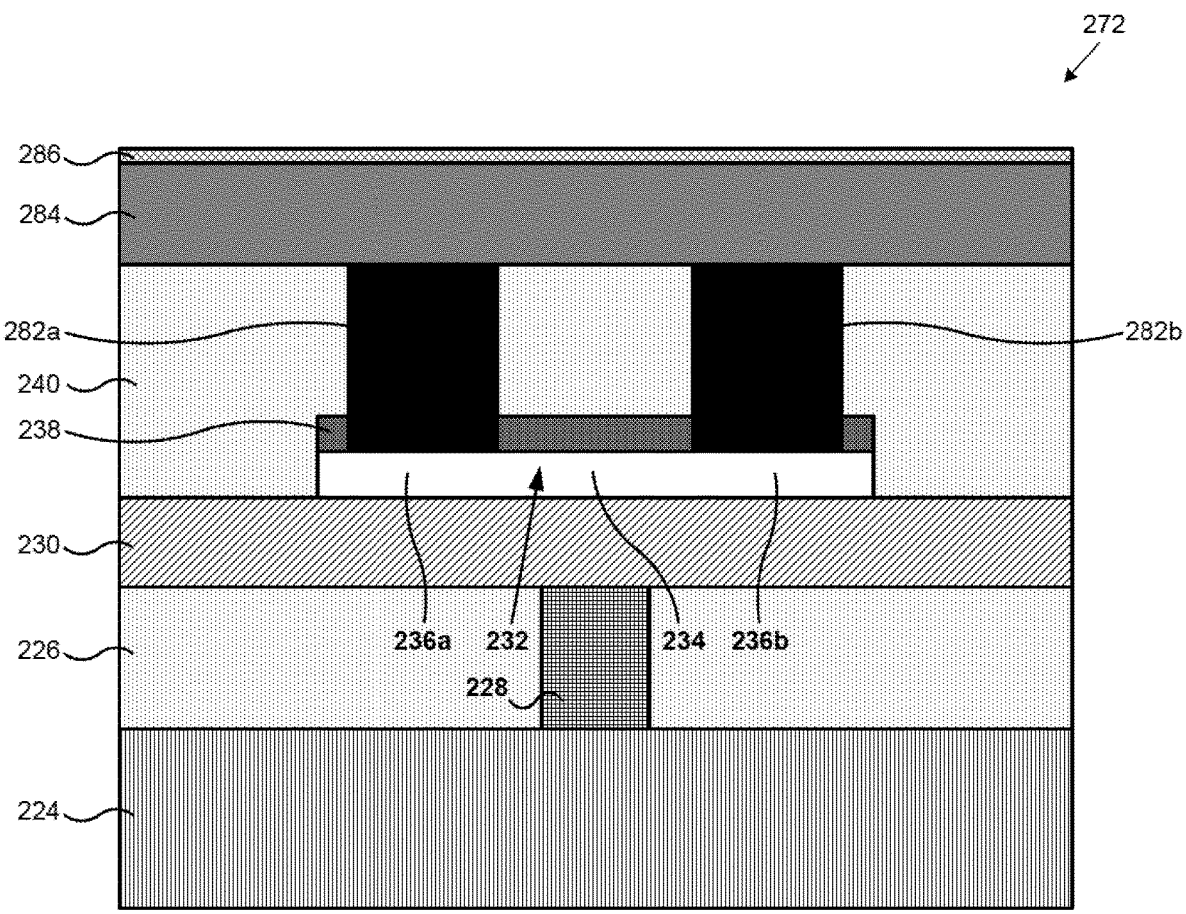
FIG. 18 illustrates a cross-sectional view of a portion of a PCM RF switch structure processed in accordance with an action in the flowchart of FIG. 14 according to one implementation of the present application.

Referring to FIG. 18, PCM RF switch structure 272 illustrates a cross-sectional view of a portion of a PCM RF switch structure processed in accordance with action 172 in the flowchart of FIG. 14 according to one implementation of the present application. As shown in FIG. 18, insulator 286 is formed on metal layer 284. In one implementation, insulator 286 is silicon nitride. In various implementations, insulator 286 is a high-k dielectric, such as tantalum pentoxide, aluminum oxide, hafnium oxide, zirconium oxide, zirconium aluminum silicate, hafnium silicate, hafnium aluminum silicate or another dielectric with a relatively high dielectric constant. In the present implementation, insulator 286 is substantially planar. Insulator 286 can be formed, for example, by PECVD or HDP-CVD. In one implementation, the thickness of insulator 286 can range from approximately two hundred angstroms to approximately six hundred angstroms (200 Å-600 Å).

Figure 19:
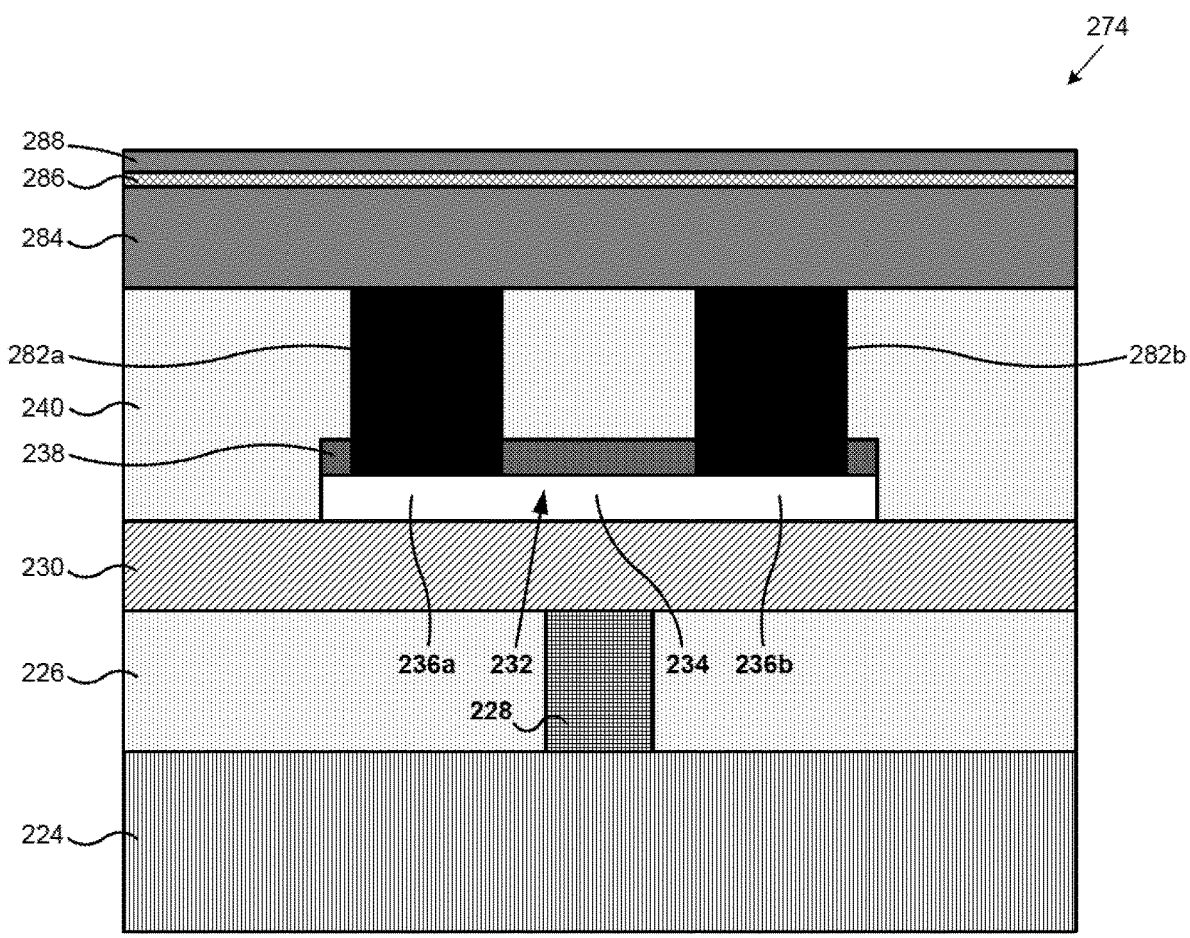
FIG. 19 illustrates a cross-sectional view of a portion of a PCM RF switch structure processed in accordance with an action in the flowchart of FIG. 14 according to one implementation of the present application.

Referring to FIG. 19, PCM RF switch structure 274 illustrates a cross-sectional view of a portion of a PCM RF switch structure processed in accordance with action 174 in the flowchart of FIG. 14 according to one implementation of the present application. As shown in FIG. 19, top metal 288 is formed on insulator 286. In various implementations, top metal 288 can comprise can comprise titanium nitride (TiN), tantalum nitride (TaN), or a stack comprising aluminum and titanium nitride or tantalum nitride. In the present implementation, top metal 288 is substantially planar. Top metal 288 can be formed by PVD, or any other suitable process. In one implementation, the thickness of top metal 288 can range from approximately five hundred angstroms to approximately one thousand angstroms (500 Å-1000 Å).

Figure 20:
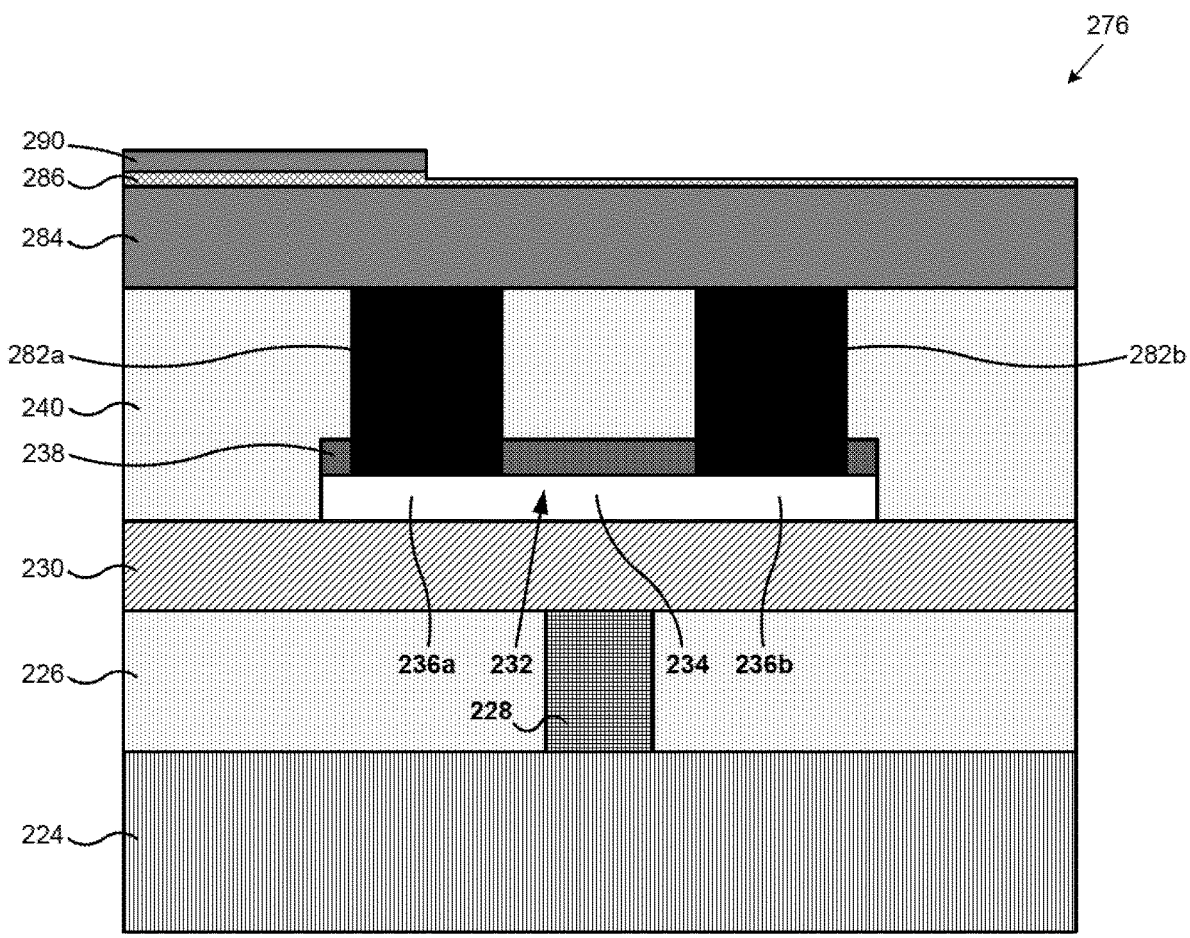
FIG. 20 illustrates a cross-sectional view of a portion of a PCM RF switch structure processed in accordance with an action in the flowchart of FIG. 14 according to one implementation of the present application.

Referring to FIG. 20, PCM RF switch structure 276 illustrates a cross-sectional view of a portion of a PCM RF switch structure processed in accordance with action 176 in the flowchart of FIG. 14 according to one implementation of the present application. As shown in FIG. 20, top metal 288 (labeled in FIG. 19) is etched to form patterned top plate 290. Top metal 288 (labeled in FIG. 19) is etched Overlying lower metal portion 282b, but remains overlying lower metal portion 282a, thereby forming patterned top plate 290. In the present implementation, insulator 286 is partially etched. In another implementation insulator 286 may remain substantially unetched.

Figure 21:
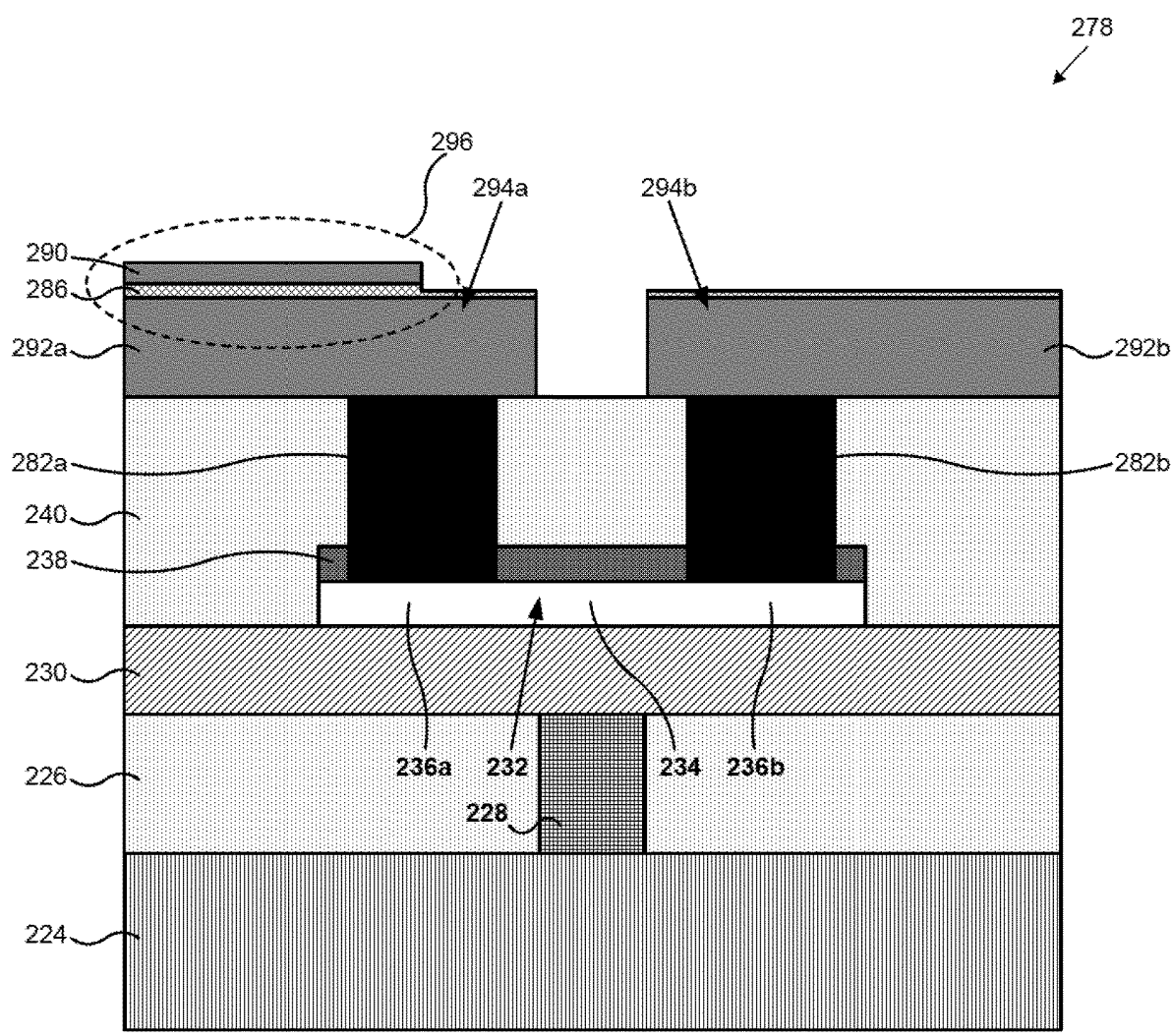
FIG. 21 illustrates a cross-sectional view of a portion of a PCM RF switch structure processed in accordance with an action in the flowchart of FIG. 14 according to one implementation of the present application.

Referring to FIG. 21, PCM RF switch structure 278 illustrates a cross-sectional view of a portion of a PCM RF switch structure processed in accordance with action 178 in the flowchart of FIG. 14 according to one implementation of the present application. As shown in FIG. 21, metal layer 284 (labeled in FIG. 20) is etched to form upper metal portions 292a and 292b, thereby forming metal-insulator-metal (MIM) capacitor 296 by upper metal portion 292a, insulator 286, and patterned top plate 290. Etching metal layer 284 to form upper metal portions 292a and 292b also thereby substantially completes capacitive RF terminal 294a and ohmic RE terminal 294b of PCM RF switch structure 278. Capacitive RF terminal 294a and ohmic RF terminal 294b provide RF signals to/from passive segments 236a and 236b respectively of PCM 212. Capacitive RF terminal 294a includes lower metal portion 282a, upper metal portion 292a, insulator 286, and patterned top plate 290. Ohmic RF terminal 294b includes lower metal portion 282b and upper metal portion 292b.

In the present implementation, upper metal portions 292a and 292b are formed by removing a middle segment of metal layer 284 (labeled in FIG. 20) between lower metal portions 282a and 282b, for example, using a chlorine based RIE. In an alternative implementation, a single damascene process can be used to form upper metal portions 292a and 292b prior to depositing insulator 286. Moreover, although lower metal portions 282a and 282b and upper metal portions 292a and 292b are separate formations in FIG. 21, in other implementations they may be parts of the same formation. For example, lower metal portions 282a and 282b and upper metal portions 292a and 292b can be formed as a single metal using a dual damascene process. As another example, lower metal portions 282a and 282b and upper metal portions 292a and 292b can be formed as a single metal by depositing a metal layer in trenches 242a and 242b (labeled in FIG. 15) and over RF terminal dielectric 240, and then etching a middle segment thereof between trenches 242a and 242b. In these examples, lower metal portions 282a and 282b and upper metal portions 292a and 292b would not have a boundary interface. Although upper metal portions 292a and 292b have overplots relative to lower metal portions 282a and 282b In FIG. 21, in various implementations, upper metal portions 292a and 292b can be aligned with lower metal portions 282a and 282b, or can have underplots relative to lower metal portions 282a and 282b.

Figure 22:
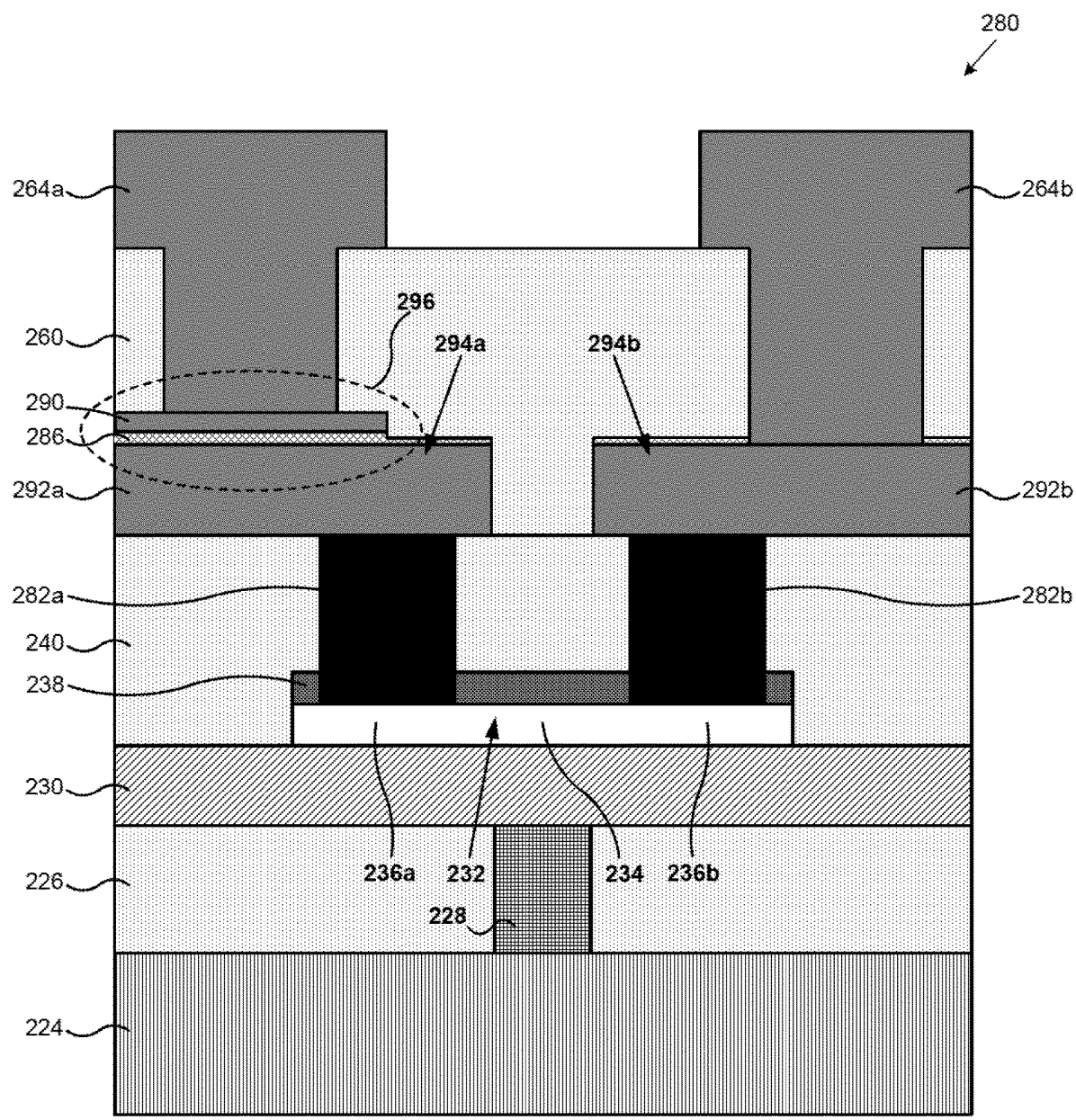
FIG. 22 illustrates a cross-sectional view of a portion of a PCM RF switch structure processed in accordance with an action in the flowchart of FIG. 14 according to one implementation of the present application.

Referring to FIG. 22, PCM RF switch structure 280 illustrates a cross-sectional view of a portion of a PCM RF switch structure processed in accordance with action 180 in the flowchart of FIG. 14 according to one implementation of the present application. Action 180 in the flowchart of FIG. 14 generally corresponds to actions 118, 120, and 122 in the flowchart of FIG. 1, and interlayer dielectric 260 and interconnect metals 264a and 264b in FIG. 22 generally correspond to interlayer dielectric 260 and interconnect metals 264a and 264b in FIG. 13, except for differences described below.

As shown in FIG. 22, interlayer dielectric 260 is formed over patterned top plate 290 of capacitive RF terminal 294a and over upper metal portion 292b of ohmic RF terminal 294b. Thus, patterned top plate 290 of MIM capacitor 296 is situated within interlayer dielectric 260. As used herein, "MIM capacitor" refers to a capacitor having a top plate formed within an interlayer dielectric where conventionally no metal (other than via or interconnect metal) exists, such as within interlayer dielectric 260.

Interconnect metal 264a is formed in an interconnect hole etched in interlayer dielectric 260, and on patterned top plate 290 of capacitive RF terminal 294a. Interconnect metal 264b is formed in an interconnect hole etched in both interlayer dielectric 260 and insulator 286, and on upper metal portion 292b of ohmic RF terminal 294b. In contrast to PCM RF switch structure 222 in FIG. 13 where interconnect metals 264a and 264b is connected to trench metal plugs 254a and 254b for capacitive RF terminal 256a and ohmic RF terminal 256b, in PCM RF switch structure 280 in FIG. 22, interconnect metal 264b is connected to upper metal portion 292b of ohmic RF terminal 294b, while interconnect metal 264a is connected to patterned top plate 290 of capacitive RF terminal 294a.

In the present implementation, upper metal portion 292b of ohmic RF terminal 294b is situated lower in PCM RF switch structure 280 relative to patterned top plate 290 of capacitive RF terminal 294a, and interconnect metal 264b extends deeper than interconnect metal 264a, because capacitive RF terminal 294a includes patterned top plate 290. Patterned top plate 290 of capacitive RF terminal 294a can perform as an etch stop while interlayer dielectric 260 and insulator 286 are selectively etched, so that patterned top plate 290 of capacitive RF terminal 294a remains substantially undamaged when deeper interconnect metal 264b is formed.

PCM RF switch structure 280 in FIG. 22 provides advantages similar to PCM RF switch structure 222 in FIG. 13 in that PCM RF switch structure 280 in FIG. 22 includes one capacitive RF terminal 294a and one ohmic RF terminal 294b for providing RF signals to/from passive segments 236a and 236b respectively of PCM 237. As described above, first, MIM capacitor 296 of capacitive RF terminal 294a capacitively couples patterned top plate 290 to upper metal portion 292a, creating part of an RF signal path of PCM RF switch structure 280, despite the fact that patterned top plate 290 and upper metal portion 292a are ohmically separated from each other. Second, because capacitive RF terminal 294a is directly connected to PCM 232 without any traces or interconnects intervening therebetween, routing resistance is lowered and the quality factor of MIM capacitor 296 is high. Third, because PCM RF switch structure 280 in FIG. 22 includes one capacitive RF terminal 294a and one ohmic RF terminal 294b, two capacitive terminals are not placed in series in the RF signal path, and thus, do not halve the total capacitance of the switch. Fourth, compared to a manufacturing process that forms two capacitive RF terminals, a manufacturing process of the present application needs only a few additional steps to form one capacitive RF terminal 294a and one ohmic RF terminal 294b.

Additionally, PCM RF switch structure 280 in FIG. 22 provides several advantages over PCM RF switch structure 222 in FIG. 13. First, because insulator 286 is only partially etched or substantially unetched after etching of patterned top plate 290, there is little or no increase in leakage current of MIM capacitor 296 and little or no decrease in the breakdown voltage of MIM capacitor 296 due to an increase in defects or voids within insulator 286. As such, the capacitance value of MIM capacitor 296 is more precisely controlled, and PCM RF switch structure 280 is more reliable.

Second, in contrast to trench metal liners 246a and 246b in PCM RF switch structure 220 in FIG. 12, lower metal portions 282a and 282b of PCM RF switch structure 280 in FIG. 22 completely fill trenches. Accordingly metal layer 284, insulator 286, and top metal 288 (labeled in FIG. 19) can be formed substantially planar. Manufacturing is simplified. And compared to dielectric liner 248 in FIG. 13 that has varying thickness in trenches 242a, insulator 286 has more uniform thickness, resulting in less breakdown variations for the MIM capacitor 296 of capacitive RF terminal 294a.

Third, MIM capacitor 296 formed by upper metal portion 292a, insulator 286, and patterned top plate 290 has a capacitance with significantly improved density. MIM capacitor 296 does not require addition of interlayer metal levels, and also does not use up lateral die space. MIM capacitor 296 advantageously increases routing capability because NUM capacitor 296 utilizes the space amply available between interlayer dielectrics, such as interlayer dielectric 260.

Thus, various implementations of the present application achieve a method of concurrently manufacturing and a structure of a PCM RF switch having both capacitive and ohmic RF terminals that overcome the deficiencies in the art while preserving or improving RF performance.

From the above description it is manifest that various techniques can be used for implementing the concepts described in the present application without departing from the scope of those concepts. For example, a single capacitor can be formed in the RF path near one RF terminal, while the other RF terminal only employs ohmic connections. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:
a phase-change material (PCM) and a heating element underlying an active segment of said PCM and extending outward and transverse to said PCM;
a capacitive RF terminal comprising a first trench metal liner situated on a first passive segment of said PCM, and a dielectric liner separating said first trench metal liner from a first trench metal plug;
an ohmic RF terminal comprising a second trench metal liner situated on a second passive segment of said PCM, and a second trench metal plug being ohmically connected to said second trench metal liner.

2. The RF switch of claim 1, wherein said first trench metal liner of said capacitive RF terminal is capacitively coupled to said first trench metal plug of said capacitive RF terminal by a trench capacitor formed by said first trench metal liner, said dielectric liner, and said first trench metal plug.

3. The RF switch of claim 2, wherein said first trench metal plug is connected to a first trench metal plug extension so as to further capacitively couple said first trench metal liner with said first trench metal plug.

4. The RF switch of claim 1, wherein said dielectric liner has an overplot relative to said first trench metal liner.

5. The RF switch of claim 1, wherein said first trench metal plug has an underplot relative to said first trench metal liner.

6. The RF switch of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

7. A method for manufacturing a capacitive RF terminal and an ohmic RF terminal in a PCM RF switch, said method comprising:
forming a first trench metal liner on a first passive segment of a PCM and a second trench metal liner on a second passive segment of said PCM;
forming a dielectric liner on said first trench metal liner;
forming a first trench metal plug on said dielectric liner to produce said capacitive RF terminal and forming a second trench metal plug on said second trench metal liner to produce said ohmic RF terminal.

8. The method of claim 7, wherein said first trench metal liner of said capacitive RF terminal is capacitively coupled to said first trench metal plug of said capacitive RF terminal by a trench capacitor formed by said first trench metal liner, said dielectric liner, and said first trench metal plug.

9. The method of claim 8, wherein said first trench metal plug is connected to a first trench metal plug extension so as to further capacitively couple said first trench metal liner with said first trench metal plug.

10. The method of claim 7, wherein said dielectric liner has an overplot relative to said first trench metal liner.

11. The method of claim 7, wherein said first trench metal plug has an underplot relative to said first trench metal liner.

12. The method of claim 7, wherein said forming said dielectric liner on said first trench metal liner comprises:
depositing said dielectric liner on said first trench metal liner and on said second trench metal liner;
removing said dielectric liner from said second trench metal liner.

13. The method of claim 7, wherein said forming said first trench metal plug and said forming said second trench metal plug comprises:
depositing a metal on said dielectric liner of a first trench and on said second trench metal liner of the second trench;
removing said metal from between said first trench and said second trench.

14. A radio frequency (RF) switch comprising:
a phase-change material (PCM) and a heating element underlying an active segment of said PCM and extending outward and transverse to said PCM;
a capacitive RF terminal comprising a trench metal liner situated on a passive segment of said PCM, wherein said trench metal liner interfaces with said passive segment of said PCM in a trench, and a dielectric liner separating said trench metal liner from a trench metal plug;
wherein said trench metal liner of said capacitive RF terminal is capacitively coupled to said trench metal plug of said capacitive RF terminal by a trench capacitor formed by said trench metal liner, said dielectric liner, and said trench metal plug.

15. The RF switch of claim 14, wherein said trench metal plug is connected to a trench metal plug extension to as to further capacitively couple said trench metal liner with said trench metal plug.

16. The RF switch of claim 14, wherein said dielectric liner has an overplot relative to said fid trench metal liner.

17. The RF switch of claim 14, wherein said trench metal plug has an underplot relative to said trench metal liner.

18. The RF switch of claim 14, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

19. The RF switch of claim 14, wherein said heating element comprises material selected from the group consisting of tungsten (W), molybdenum (Mo), titanium (Ti), titanium nitride (TiN), titanium tungsten (TiW), tantalum (Ta), nickel chromium (NiCr), and nickel chromium silicon (NiCrSi).

* * * * *

UNITED STATES PATENT AND TRADEMARK OFFICE
CERTIFICATE OF CORRECTION

PATENT NO. : 10,937,960 B2
APPLICATION NO. : 16/271505
DATED : March 2, 2021
INVENTOR(S) : Slovin et al.

It is certified that error appears in the above-identified patent and that said Letters Patent is hereby corrected as shown below:

In the Claims

Column 16, Line 43, "liner has an overplot relative to said fid trench metal liner." should be --liner has an overplot relative to said trench metal liner.--

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*